(12) United States Patent
Watanabe et al.

(10) Patent No.: US 9,780,293 B2
(45) Date of Patent: Oct. 3, 2017

(54) PIEZOELECTRIC MATERIAL, PIEZOELECTRIC ELEMENT, AND ELECTRONIC APPARATUS

(71) Applicant: CANON KABUSHIKI KAISHA, Tokyo (JP)

(72) Inventors: Takayuki Watanabe, Yokohama (JP); Shunsuke Murakami, Kawasaki (JP); Miki Ueda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 209 days.

(21) Appl. No.: 14/424,017

(22) PCT Filed: Aug. 21, 2013

(86) PCT No.: PCT/JP2013/072928
§ 371 (c)(1),
(2) Date: Feb. 25, 2015

(87) PCT Pub. No.: WO2014/034693
PCT Pub. Date: Mar. 6, 2014

(65) Prior Publication Data
US 2015/0221857 A1    Aug. 6, 2015

(30) Foreign Application Priority Data
Aug. 27, 2012   (JP) ................................ 2012-186595

(51) Int. Cl.
| | |
|---|---|
| *H01L 41/187* | (2006.01) |
| *H01L 41/083* | (2006.01) |
| *H01L 41/273* | (2013.01) |
| *C04B 35/495* | (2006.01) |
| *G02B 27/00* | (2006.01) |
| *H02N 2/00* | (2006.01) |
| *H04N 5/217* | (2011.01) |
| *B41J 2/14* | (2006.01) |
| *H02N 2/10* | (2006.01) |
| *H02N 2/18* | (2006.01) |
| *C04B 35/626* | (2006.01) |
| *C04B 35/64* | (2006.01) |
| *H04N 5/232* | (2006.01) |
| *H01L 41/047* | (2006.01) |
| *H01L 41/09* | (2006.01) |
| *H01L 41/277* | (2013.01) |
| *H01L 41/297* | (2013.01) |
| *H01L 41/333* | (2013.01) |
| *B06B 1/06* | (2006.01) |

(52) U.S. Cl.
CPC ...... *H01L 41/1873* (2013.01); *B41J 2/14233* (2013.01); *C04B 35/495* (2013.01); *C04B 35/6261* (2013.01); *C04B 35/62645* (2013.01); *C04B 35/62695* (2013.01); *C04B 35/64* (2013.01); *H01L 41/0471* (2013.01); *H01L 41/0477* (2013.01); *H01L 41/083* (2013.01); *H01L 41/09* (2013.01); *H01L 41/273* (2013.01); *H01L 41/277* (2013.01); *H01L 41/297* (2013.01); *H01L 41/333* (2013.01); *H02N 2/106* (2013.01); *H02N 2/183* (2013.01); *H04N 5/2171* (2013.01); *H04N 5/23209* (2013.01); *B06B 1/0611* (2013.01); *B41J 2202/03* (2013.01); *C04B 2235/3201* (2013.01); *C04B 2235/3203* (2013.01); *C04B 2235/3215* (2013.01); *C04B 2235/3232* (2013.01); *C04B 2235/3236* (2013.01); *C04B 2235/3255* (2013.01); *C04B 2235/3281* (2013.01); *C04B 2235/604* (2013.01); *C04B 2235/768* (2013.01); *C04B 2235/77* (2013.01); *C04B 2235/786* (2013.01); *C04B 2235/79* (2013.01); *C04B 2235/80* (2013.01); *C04B 2235/81* (2013.01); *C04B 2235/85* (2013.01); *G02B 27/0006* (2013.01)

(58) Field of Classification Search
CPC ............. H01L 41/1873; H01L 41/0471; H01L 41/0477; H01L 41/09; H01L 41/273; H01L 41/277; H01L 41/297; H01L 41/333; C04B 35/4686
See application file for complete search history.

(56) References Cited

U.S. PATENT DOCUMENTS

| | | |
|---|---|---|
| 2003/0071240 A1 | 4/2003 | Kimura |
| 2008/0061263 A1* | 3/2008 | Kawada ................ C04B 35/495 252/62.9 PZ |
| 2008/0068488 A1 | 3/2008 | Kawai |
| 2011/0221828 A1 | 9/2011 | Sakai |

FOREIGN PATENT DOCUMENTS

| | | |
|---|---|---|
| CN | 1226232 C | 11/2005 |
| CN | 1706773 A | 12/2005 |

(Continued)

OTHER PUBLICATIONS

F. Benabdallah et al. Dielectric, pyroelectric and piezoelectric properties in the (1-x) (0.1BaTiO3-0.9NaNb03)-xLiNb03 system; Solid State Sciences; vol. 14 pp. 1333-1337 (2012).

(Continued)

*Primary Examiner* — Carol M Koslow
(74) *Attorney, Agent, or Firm* — Canon U.S.A., Inc. IP Division

(57) ABSTRACT

The present invention provides a piezoelectric material not containing lead and potassium, having a high relative density, a high Curie temperature, and a high mechanical quality factor, and exhibiting good piezoelectricity. The piezoelectric material contains 0.04 percent by mole or more and 2.00 percent by mole or less of Cu relative to 1 mol of metal oxide represented by General formula (1) below.

$((Na_{1-z}Li_z)_xBa_{1-y})(Nb_yTi_{1-y})O_3$ (in Formula, $0.70 \leq x \leq 0.99$, $0.75 \leq y \leq 0.99$, and $0 < z < 0.15$, and $x < y$)    General formula (1)

23 Claims, 15 Drawing Sheets

(56) References Cited

FOREIGN PATENT DOCUMENTS

| | | |
|---|---|---|
| CN | 101186493 A | 5/2008 |
| CN | 102511088 A | 6/2012 |
| JP | 2003-348401 A | 12/2003 |
| JP | 2004-002051 A | 1/2004 |
| JP | 2004-244300 A | 9/2004 |
| JP | 2004-244301 A | 9/2004 |
| JP | 2010-141979 A | 6/2010 |
| JP | 2011-176114 A | 9/2011 |
| JP | 2011171359 A | 9/2011 |
| JP | 2012-017248 A | 1/2012 |
| KR | 20020090895 A | 12/2002 |
| WO | 2006/117990 A1 | 11/2006 |
| WO | 2011102329 A1 | 8/2011 |

OTHER PUBLICATIONS

K. Zhu et al. Effects of CuO Dopping on Properties of NaNbO3-BaTiO3 Lead-Free Piezoelectric Ceramics; Journal of the Chinese Ceramic Society, vol. 38. pp. 1031-1035 (2010) China.

Aboltinya IV et al. Preparation of Multicomponent Niobate Piezoelectric Ceramic; Inorganic Materials, vol. 23, No. 10 pp. 1521-1524 (1987).

\* cited by examiner

PIEZOELECTRIC MATERIAL, PIEZOELECTRIC ELEMENT, AND ELECTRONIC APPARATUS

TECHNICAL FIELD

The present invention relates to a piezoelectric material. In particular, the present invention relates to a lead-free piezoelectric material. Also, the present invention relates to a piezoelectric element by using the above-described piezoelectric material, a stacked piezoelectric element, a method for manufacturing a stacked piezoelectric element, a liquid-ejection head, a liquid-ejection apparatus, an ultrasonic motor, an optical apparatus, a vibration apparatus, a dust removal apparatus, an image pickup apparatus, and an electronic apparatus.

BACKGROUND ART

Lead zirconate titanate containing lead is a typical piezoelectric material, and has been used in various piezoelectric devices, e.g., actuators, oscillators, sensors, and filters. However, a lead component in a discarded piezoelectric material may be eluted into the soil and may have a harmful influence on an ecosystem. Therefore, in order to produce lead-free piezoelectric devices, research and development of lead-free piezoelectric material have been performed intensively.

Typical lead-free piezoelectric materials which are widely researched at present are piezoelectric materials containing potassium niobate. However, when the piezoelectric material containing potassium is synthesized, the hygroscopicity of a raw material (for example, potassium carbonate) powder is high, so that it is difficult to accurately weigh the raw material powder at a predetermined molar ratio. A piezoelectric material containing potassium niobate ($KNbO_3$) has deliquescence, and the piezoelectricity of piezoelectric ceramic containing potassium niobate may be degraded with time. In addition, there is a problem in that ceramic having a high relative density is not obtained easily from the piezoelectric material containing potassium niobate.

NPL 1 discloses a material represented by $(1-x)(0.1BaTiO_3-0.9NaNbO_3)-xLiNbO_3$ (where $0 \leq x \leq 0.125$). The Curie temperature is increased by allowing $0.1BaTiO_3-0.9NaNbO_3$ to make a solid solution with $LiNbO_3$. The Curie temperatures when x=0.01 and 0.02 are 526 K (253° C.) and 531 K (258° C.), respectively. However, there is a problem in that in the case where the amount of $LiNbO_3$ is 1% or more, a high-density sample is not obtained. Also, there is a problem in that if the amount of $LiNbO_3$ increases, both the magnitude of spontaneous polarization and the magnitude of piezoelectric constant $d_{31}$ decrease.

NPL 2 discloses that when CuO is added to $0.9NaNbO_3-0.1BaTiO_3$ by up to 0.3 percent by mole, the relative density of a sintered body increases, pores decrease, the piezoelectric constant ($d_{33}$), the electromechanical coupling coefficient ($k_p$), and the mechanical quality factor (Qm) increase, and the dielectric loss tangent (tan δ) decreases. However, there is a problem in that if the amount of addition of CuO is 0.4 percent by mole or more, the relative density of the sintered body, $d_{33}$, $k_p$, and Qm decrease because an impurity phase is generated.

CITATION LIST

Non Patent Literature

NPL 1 F. Benabdallah et al. "Solid State Sciences", Vol. 14, pp. 1333-1337 (2012)

NPL 2 K. Zhu et al. "Journal of the Chinese Ceramic Society", Vol. 38, pp. 1031-1035 (2010)

SUMMARY OF INVENTION

Technical Problem

According to the technology in the related art, a solid solution of $NaNbO_3$, $BaTiO_3$, and $LiNbO_3$ has problems in that an impurity phase is generated easily, the density is low, and the piezoelectric constant and the mechanical quality factor are low.

The present invention provides a piezoelectric material not containing lead and potassium, having a high density, a high Curie temperature, and a high mechanical quality factor, and exhibiting good piezoelectricity. Also, the present invention provides a piezoelectric element by using the above-described piezoelectric material, a stacked piezoelectric element, a method for manufacturing a stacked piezoelectric element, a liquid-ejection head, a liquid-ejection apparatus, an ultrasonic motor, an optical apparatus, a vibration apparatus, a dust removal apparatus, an image pickup apparatus, and an electronic apparatus.

Solution to Problem

A piezoelectric material according to an aspect of the present invention contains 0.04 percent by mole or more and 2.00 percent by mole or less of Cu relative to 1 mol of metal oxide represented by General formula (1) below.

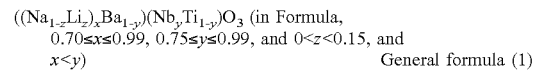
$$((Na_{1-z}Li_z)_xBa_{1-y})(Nb_yTi_{1-y})O_3 \text{ (in Formula,}$$
$$0.70 \leq x \leq 0.99, 0.75 \leq y \leq 0.99, \text{ and } 0 < z < 0.15, \text{ and}$$
$$x < y) \quad \text{General formula (1)}$$

A piezoelectric element according to an aspect of the present invention includes a first electrode, a piezoelectric material, and a second electrode, wherein the above-described piezoelectric material is the piezoelectric material according to aspects of the present invention.

Further features of the present invention will become apparent from the following description of exemplary embodiments with reference to the attached drawings.

Advantageous Effects of Invention

According to aspects of the present invention, a piezoelectric material not containing lead and potassium, having a high relative density, a high Curie temperature, and a high mechanical quality factor, and exhibiting good piezoelectricity is provided. The piezoelectric material according to aspects of the present invention does not use lead and, therefore, a load to the environment is small. Furthermore, potassium is not used and, therefore, excellent sinterability and moisture resistance are exhibited.

DESCRIPTION OF EMBODIMENTS

Figure 1:
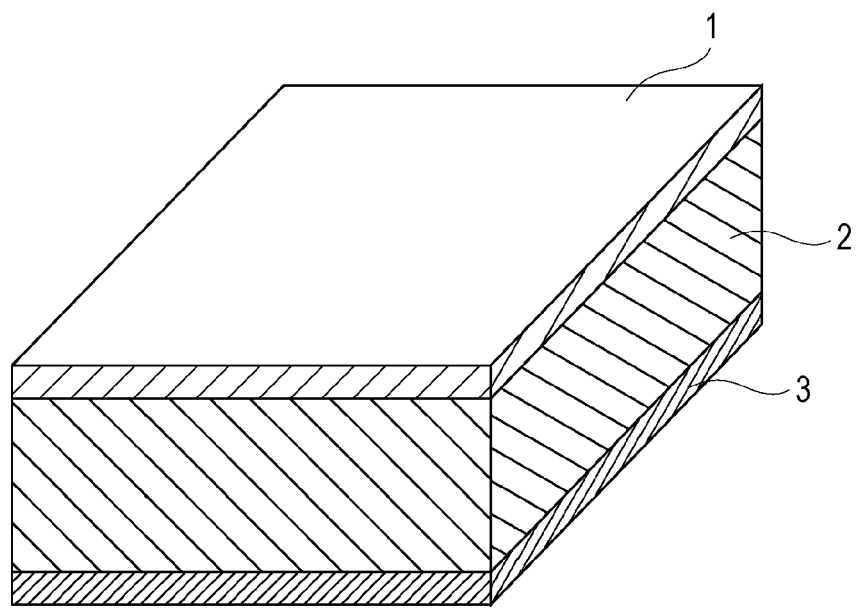
FIG. 1 is a schematic diagram showing the configuration of a piezoelectric element according to an embodiment of the present invention.

Embodiments according to the present invention will be described below.

According to an aspect of the present invention, a lead-free piezoelectric material containing $NaNbO_3$, $BaTiO_3$, and $LiNbO_3$ as primary components, having a high density, a high Curie temperature, and a high mechanical quality factor, and exhibiting good piezoelectricity and insulating property is provided. The piezoelectric material according to an aspect of the present invention may be utilized for various purposes, e.g., capacitors, memories, and sensors, taking advantage of characteristics as a dielectric.

The piezoelectric material according to an aspect of the present invention contains 0.04 percent by mole or more and 2.00 percent by mole or less of Cu relative to 1 mol of metal oxide represented by General formula (1) below.

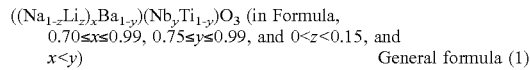

$((Na_{1-z}Li_z)_xBa_{1-y})(Nb_yTi_{1-y})O_3$ (in Formula, $0.70 \leq x \leq 0.99$, $0.75 \leq y \leq 0.99$, and $0 < z < 0.15$, and $x < y$)      General formula (1)

The piezoelectric material according to an aspect of the present invention can contain a perovskite metal oxide as a main phase from the viewpoint of the insulating property. The above-described composition formula corresponds to the perovskite structure represented by $ABO_3$. However, depending on a combination of specific elements and a synthetic condition, tungsten bronze type metal oxides represented by, for example, $Li_4Na_2Ti_4Ba_4Nb_6O_{30}$ may be incidentally generated besides the perovskite metal oxide. Such an impurity phase is avoided as much as possible because the resistivity of the piezoelectric material is lowered by an order of magnitude or more. It is possible to determine whether the main phase is the perovskite metal oxide on the basis of, for example, whether the maximum diffraction intensity attributed to the perovskite metal oxide is more than or equal to 100 times the maximum diffraction intensity attributed to the impurity phase or not in X-ray diffraction. The perovskite metal oxide can be a constituent alone because the insulating property is maximized.

In the present invention, the perovskite metal oxide refers to a metal oxide having the perovskite structure, as described in "Iwanami Rikagaku Jiten (Iwanami Dictionary of Phisics and Chemistry)" the 5th Edition (Iwanami Shoten, Publishers, issued on Feb. 20, 1998). In general, the metal oxide having the perovskite structure is expressed by a chemical formula $ABO_3$. In the perovskite metal oxide, each of A and B elements is in the form of an ion and occupies a specific position called A site and B site, respectively, of a unit cell. For example, in a cubic unit cell, the A element is located at a vertex of a cube, and the B element is located at a body center. The O element occupies a position of a face center of a cube in the form of a negative ion of oxygen.

In the metal oxide represented by General formula (1) described above, metal elements located at the A site are Na, Li, and Ba and metal elements located at the B site are Nb and Ti. However, part of Na, Li, and Ba may be located at the B site. Likewise, part of Nb and Ti may be located at the A site.

In General formula (1) described above, the molar ratio of the element at the B site to the O element is 1:3. However, even the case where the ratio of the amounts of element deviates to some extent (for example, 1.00:2.94 to 1.00:3.06) is included in the scope of the present invention insofar as the above-described metal oxide has the perovskite structure as a main phase.

The form of the piezoelectric material according to an aspect of the present invention is not specifically limited and may be any one of the forms of ceramic, powder, single crystal, film, slurry, and the like, although ceramic can be employed. In the present specification, the term "ceramic" refers to a so-called polycrystal which contains a metal oxide as a basic component and which is an aggregate of crystal grains. Products worked after sintering are also included.

In General formula (1), if x indicating the abundance of Na and Li at the A site is less than 0.7, Na and Li are deficient relative to Nb and, thereby, impurity phases (phases having X-ray diffraction patterns similar to those of $Ba_4Nb_2O_9$, $BaTi_7Nb_9O_{42}$, $Ba_3Nb_4Ti_4O_{21}$, $Ba_3Nb_{3.2}Ti_5O_{21}$, and the like) are generated. The resistivity of a metal oxide sample containing large amounts of impurity phases is a low $10^7$ to $10^8$ Ωcm and a polarization treatment is difficult.

If x is more than 0.99, the sum of the number of moles of A site elements becomes more than 1 which is the sum of the number of moles of B site elements and the piezoelectricity is reduced. Therefore, when x is within the range of $0.70 \leq x \leq 0.99$, a piezoelectric material exhibiting good insulating property and piezoelectricity is obtained.

In General formula (1), if y indicating the amount of Nb at the B site is less than 0.75, the Curie temperature may become lower than room temperature depending on the value of z. On the other hand, if y is more than 0.99, the piezoelectricity is reduced. Therefore, when y is within the range of $0.75 \leq y \leq 0.99$, the Curie temperature is higher than room temperature and good piezoelectricity is obtained.

When y is within the range of 0.75≤y≤0.89, the Curie temperature is generally within the range of 90° C. to 230° C., and the polarization treatment is easy. In addition, good piezoelectricity can be obtained.

The Curie temperature refers to a temperature, at which or at a temperature higher than which the piezoelectricity of a piezoelectric material disappears. In the present specification, a temperature, at which the dielectric constant becomes locally maximum, in the vicinity of the phase transition temperature between a ferroelectric phase and a paraelectric phase is specified to be the Curie temperature. Meanwhile, the piezoelectric material according to an aspect of the present invention has a successive phase transition temperature, at which successive phase transition from a tetragonal ferroelectric phase to an orthorhombic ferroelectric phase occurs, in a temperature region lower than the Curie temperature. At the successive phase transition temperature, the relative dielectric constant shows a local maximum or inflection point, so that the successive phase transition temperature may be determined by evaluating the temperature dependence of the relative dielectric constant, as with the Curie temperature. For example, in the solid solution represented by $0.9NaNbO_3\text{-}0.1BaTiO_3$, phase transition occurs from an orthorhombic system to a tetragonal system, and then, to a cubic system as the temperature increases.

The piezoelectric performance becomes local maximum in the vicinity of the successive phase transition temperature. Therefore, in the case where a constant piezoelectric performance independent of the temperature is required in a drive temperature range of a device (for example, −30° C. to 60° C.), it is desirable that the successive phase transition do not occur within the drive temperature range. On the other hand, in the case where enhancement in the piezoelectric performance at some specific temperature rather than the piezoelectric performance being independent of the temperature is regarded as important, successive phase transition may be set within the range of the drive temperature of the device. The material having a successive phase transition temperature adjustable in accordance with the specification of the device is excellent because of high versatility.

In the piezoelectric material according to an aspect of the present invention, the Curie temperature is increased by substituting less than 15% of Na with Li. In General formula (1), if z indicating the abundance of Li at the Na site is 15% or more, the piezoelectricity is reduced. Meanwhile, the piezoelectric material according to an aspect of the present invention contains both Li and Cu and, therefore, is excellent in the relative density, the resistivity, the electromechanical coupling coefficient, the mechanical quality factor, and the piezoelectric constant as compared with the metal oxide containing only one of Li and Cu because it is possible to reduce site defects.

The piezoelectric material according to an aspect of the present invention contains 0.04 percent by mole or more and 2 percent by mole or less of Cu relative to 1 mol of metal oxide represented by General formula (1) described above. In the case where the Cu content of the piezoelectric material according to an aspect of the present invention is within the range of 0.04 percent by mole or more and 2 percent by mole or less, the resistivity, the electromechanical coupling coefficient, the mechanical quality factor, the Young's modulus, and the relative density are allowed to increase, and the sintering temperature is allowed to decrease.

The sintering temperature refers to the lowest firing temperature required for obtaining a sintered body having a relative density of 90% or more. The sintering temperature is set at a temperature 200° C. higher than the calcination temperature in many cases.

In the piezoelectric material according to an aspect of the present invention, Cu serving as a donor occupies part of the Na or Li site (hereafter referred to as Na/Li site), so that pinning of spontaneous polarization is reduced. In the case where the Ba site in the same A site is occupied, it is believed that an effect is not obtained because Cu and Ba are equally divalent.

Copper does not occupy only the Na/Li site. If the assumption is made that Cu continue to occupy only the Na/Li site, when a certain amount is exceeded, the resistivity may decrease because Cu is a donor. However, in the piezoelectric material according to an aspect of the present invention, Cu occupies the Na/Li site until an optimum value is reached and, thereafter, Cu appears at grain boundaries. Consequently, both the effect of occupation of part of the Na/Li site by Cu serving as a donor and the effect of appearance of CuO or an oxide containing Cu at grain boundaries are obtained.

In the case where Cu occupies the Na/Li site, at least one of the following effects may be expected.
(1) Increase in resistivity
(2) Increase in phase difference of impedance during non-resonance and during resonance
(3) Increase in remanent polarization value evaluated by polarization-electric field hysteresis curve measurement or decrease in coercive electric field
(4) Increase in electromechanical coupling coefficient
(5) Reduction in mechanical quality factor
(6) Reduction in Young's modulus
(7) Reduction in dielectric loss tangent (tan δ)

In the case where Cu is present at grain boundaries, at least one of the following effects may be expected.
(1) Increase in density
(2) Decrease of pores between grains
(3) Increase in Young's modulus
(4) Increase in mechanical quality factor These effects appear in a superposed manner in accordance with the place where Cu is present.

Part of added Cu may partly occupy the B site (Nb and Ti sites). However, Cu can present mainly at the A site or grain boundaries. In the case where Cu serving as an acceptor partly occupies the B site, an oxygen defect is generated in a unit cell to keep charge balance. Copper at the B site and the oxygen defect forms a defect dipole and an internal electric field is generated in the piezoelectric ceramic. When a polarization-electric field hysteresis loop measurement of a sample, in which internal electric fields are generated, is performed before a polarization treatment, a propeller-type double hysteresis loop is observed because of an interaction between the spontaneous polarization and the internal electric fields, as observed with respect to an antiferroelectric. That is, a macroscopic remanent polarization value becomes significantly small. It is difficult to use such a material for a ferroelectric memory required to have a large remanent polarization value for storing and reading information. When the sample, in which internal electric fields are generated, is subjected to the polarization treatment, the directions of the internal electric fields are aligned in one direction. As a result, when a polarization-electric field hysteresis loop measurement of a sample subjected to the polarization treatment is performed, a hysteresis curve is shifted in the x axis (electric field axis) direction. If many acceptor elements occupy the B site and the amount of shift becomes larger than the coercive electric field, the polarization state in a non-electric field state becomes one and, thereby, utilization as a ferroelectric memory is not possible. Consequently, part of Cu may partly occupy the B site, although Cu can present mainly at the A site, grain boundaries, or both of them.

The place where Cu is present may be observed with an electric microscope or be estimated on the basis of the above-described effect. The place of presence may also be identified on the basis of the following measurement.

In the case where Cu occupies the Na/Li site, a Cu ion is smaller than a Na ion and a Li ion, so that the volume of a unit cell decreases. In the case where Cu occupies the B site, a Cu ion is larger than a Nb ion and a Ti ion, so that the volume of a unit cell increases. The volume of the unit cell may be evaluated by X-ray diffraction. For example, in the case where Cu occupies the A site and the B site in succession, the lattice volume decreases once and, then, increases.

The distribution of Cu in the sample and an occupation site in a crystal may also be evaluated by energy dispersive X-ray spectroscopy, wavelength dispersive X-ray spectroscopy, Raman scattering, and a transmission electron microscope.

If more than 2 percent by mole of Cu is contained relative to 1 mol of the above-described metal oxide, an impurity phase may be generated and the piezoelectricity may be reduced. If Cu is less than 0.04 percent by mole relative to 1 mol of the above-described metal oxide, occupation of the Na/Li site by Cu or the amount of Cu-containing oxides deposited at the grain boundaries may be insufficient, and the effect of addition of Cu is not obtained.

In General formula (1) described above, the piezoelectric material according to an aspect of the present invention can satisfy $x<y$. If Ba is deficient relative to Ti, irregular grain growth is facilitated unfavorably. Meanwhile, it is believed that if the Ba site is occupied by Cu, the above-described effect is not obtained because the two have the same valence. If x is smaller than y, Cu serving as a donor is taken into a crystal lattice and the effect of the present invention is exerted easily. Therefore, x can be smaller than y. The composition of a starting raw material can be adjusted in such a way that x becomes smaller than y. If x is larger than or equal to y, the insulating property of the sample is reduced significantly.

Part of Ba may be substituted with a divalent metal element, e.g., Sr or Ca, for the purpose of facilitating production of the piezoelectric material according to an aspect of the present invention or adjusting the properties of the piezoelectric material according to an aspect of the present invention. Likewise, part of Nb may be substituted with pentavalent metal element, e.g., Ta or V, within the range of not exceeding 20 percent by mole. The firing temperature of the piezoelectric material is lowered by substituting part of Nb with V. The successive phase transition temperature of the piezoelectric material is lowered by substituting part of Nb with Ta. Likewise, part of Ti may be substituted with tetravalent metal element, e.g., Sn or Zr, within the range of not exceeding 20 percent by mole. The successive phase transition temperature of the piezoelectric material is lowered by substituting part of Ti with Sn. The piezoelectric constant of the piezoelectric material is increased by substituting part of Ti with Zr. Meanwhile, more than 0 percent by mole and 5 percent by mole or less of Ni may be added relative to 1 percent by mole of the piezoelectric material according to an aspect of the present invention. Addition of Ni may increase the piezoelectric constant and the resistivity of the piezoelectric material and lower the firing temperature.

In the case where the piezoelectric material according to an aspect of the present invention is in the shape of a sintered body, it is necessary to produce a compact before firing. The above-described compact is a solid material produced by forming a raw material powder. The raw material powder can have a higher purity. Examples of forming methods may include uniaxial pressure processing, cold hydrostatic processing, warm hydrostatic processing, casting, and extrusion. In production of the compact, a granulated powder can be used. Sintering of a compact by using the granulated powder has an advantage that the distribution of the sizes of crystal grains of a sintered body becomes uniform easily.

The method for granulating the raw material powder for the piezoelectric material is not specifically limited. The most suitable granulation method is a spray-drying method from the viewpoint of ensuring uniform particle diameter of the granulated powder.

Examples of binders usable in granulation include polyvinyl alcohol (PVA), polyvinyl butyral (PVB), and acrylic reins. The amount of addition of the binder is preferably 1 part by weight to 10 parts by weight relative to the raw material powder of the above-described piezoelectric material, and 2 parts by weight to 5 parts by weight is more preferable from the viewpoint of an increase in compact density.

The method for sintering the above-described compact is not specifically limited.

Examples of sintering methods include sintering with an electric furnace, sintering with a gas furnace, an ohmic heating method, a microwave sintering method, a millimeter wave sintering method, and hot isostatic press (HIP). Sintering with an electric furnace or a gas may be a continuous type or a batch type.

The sintering temperature in the above-described sintering method is not specifically limited, but can be a temperature at which the individual compounds are reacted and crystal growth occurs sufficiently. From the viewpoint of specifying particle diameters to be within the range of 1 μm to 10 μm, the sintering temperature is preferably 1,050° C. or higher and 1,300° C. or lower, and more preferably 1,100° C. or more and 1,200° C. or less. The piezoelectric material sintered in the above-described temperature range exhibits good piezoelectric performance. In order to stabilize the characteristics of the piezoelectric material, which has been produced by the sintering treatment, with a high degree of reproducibility, the sintering treatment can be performed for 2 hours or more and 48 hours or less while the sintering temperature is specified to be constant within the above-described range. A two-step sintering method or other sintering methods may be used, although a method in which there is no sharp temperature change can be employed in consideration of the productivity.

The piezoelectric material obtained by the sintering treatment is ground and, thereafter, can be heat-treated at a temperature higher than or equal to the Curie temperature. A residual stress is generated in the inside of the piezoelectric material subjected to mechanical grinding. However, the residual stress is relaxed by a heat treatment at the Curie temperature or higher and the piezoelectric characteristics of the piezoelectric material are further improved. The heat treatment time is not specifically limited and is preferably 1 hour or more.

In the case where the crystal grain size of the piezoelectric material according to an aspect of the present invention is more than 100 μm, the strength may be low in cutting and grinding. Meanwhile, if the grain size is less than 0.3 μm, the piezoelectricity is reduced. Consequently, the grain size range is preferably 0.3 μm or more and 100 μm or less on an average grain size basis, and more preferably 3 μm or more and 30 μm or less.

The term "grain size" in aspects of the present invention refers to a generally called "projected area equivalent circle diameter" in a microscope observation method and refers to a diameter of a perfect circle having the same area as the projected area of a crystal grain. In aspects of the present invention, the method for measuring the grain size is not specifically limited. For example, the grain size may be determined by image processing of a photograph obtained photographing the surface of the piezoelectric material with a polarization microscope or a scanning electron microscope. The optimum magnification is different depending on a targeted grain size and, therefore, an optical microscope and an electron microscope may be switched. The equivalent circle diameter may be determined from an image of a ground surface or a cross-section rather than the surface of the material.

In the case where the piezoelectric material according to an aspect of the present invention is utilized as a film disposed on a substrate, it is desirable that the thickness of the above-described piezoelectric material is 200 nm or more and 10 μm or less, and more preferably 300 nm or more and 3 μm or less. This is because electromechanical transducing function sufficient for a piezoelectric element is obtained by specifying the film thickness of the piezoelectric material to be 200 nm or more and 10 μm or less.

The method for forming the above-described film is not specifically limited. Examples include a chemical solution deposition method (CSD method), a sol-gel method, a metal organic chemical vapor deposition method (MOCVD method), a sputtering method, a pulse laser deposition method (PLD method), a hydrothermal synthesis method, and an aerosol deposition method (AD method). Among them, the chemical solution deposition method or the sputtering method can be especially employed as a stacking method. The chemical solution deposition method or the sputtering method may achieve a large film formation area easily. The substrate used for the piezoelectric material according to an aspect of the present invention can be a single crystal substrate cut and ground along a (001) face or (110) face. In the case where the single crystal substrate cut and ground along a specific crystal face is used, a piezoelectric material film disposed on the substrate surface is allowed to be strongly aligned in the same direction.

Next, a piezoelectric element by using the piezoelectric material according to an aspect of the present invention will be described.

FIG. 1 is a schematic diagram showing the configuration of a piezoelectric element according to an embodiment of the present invention. The piezoelectric element according to an aspect of the present invention is a piezoelectric element including at least a first electrode 1, a piezoelectric material portion 2, and a second electrode 3, wherein the piezoelectric material constituting the above-described piezoelectric material portion 2 is the piezoelectric material according to an aspect of the present invention.

The piezoelectric characteristics of the piezoelectric material according to an aspect of the present invention may be evaluated by making a piezoelectric element including at least a first electrode and a second electrode. The above-described first electrode and second electrode are formed from electrically conductive layers having a thickness of about 5 nm to 2,000 nm. The material therefor is not specifically limited and may be a material commonly used for the piezoelectric element. Examples may include metals, e.g., Ti, Pt, Ta, Ir, Sr, In, Sn, Au, Al, Fe, Cr, Ni Pd, Ag, and Cu, and compounds thereof.

The above-described first electrode and second electrode may be made of one type thereof or be made by stacking at least two types thereof. The first electrode and the second electrode may be made of materials different from each other.

The method for manufacturing the above-described first electrode and second electrode is not specifically limited, baking of a metal paste may be employed for formation, and a sputtering method, an evaporation method, or the like may be employed for formation. Both the first electrode and the second electrode may be used after being patterned into predetermined shapes.

In the above-described piezoelectric element, polarization axes can be aligned in a given direction. Alignment of the polarization axes in a given direction increases the piezoelectric constant of the above-described piezoelectric element.

The method for polarizing the above-described piezoelectric element is not specifically limited. The polarization treatment may be performed in the air or in oil. The polarization temperature is preferably 60° C. to 160° C., although the optimum condition is somewhat different depending on the composition of the piezoelectric material constituting the element. The electric field applied to perform the polarization treatment can be more than or equal to the coercive field of the material and, specifically, is 1 to 5 kV/mm.

The piezoelectric constant and the mechanical quality factor may be determined by calculation from measurement results of resonance frequency and antiresonance obtained by using a commercially available impedance analyzer on the basis of the Japanese Electronics and Information Technology Industries Association Standards (JEITA EM-4501). Hereafter this method is referred to as a resonance-antiresonance method.

Next, a stacked piezoelectric element by using the piezoelectric material according to an aspect of the present invention will be described.

The stacked piezoelectric element is a stacked piezoelectric element in which piezoelectric material layers and electrodes including internal electrodes are stacked alternately, wherein the above-described piezoelectric material layer is made of the piezoelectric material according to an aspect of the present invention.

Figure 2A:
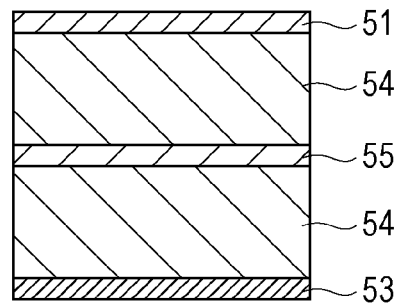
FIGS. 2A and 2B are schematic sectional views showing configurations of stacked piezoelectric elements according to embodiments of the present invention.
Figure 2B:
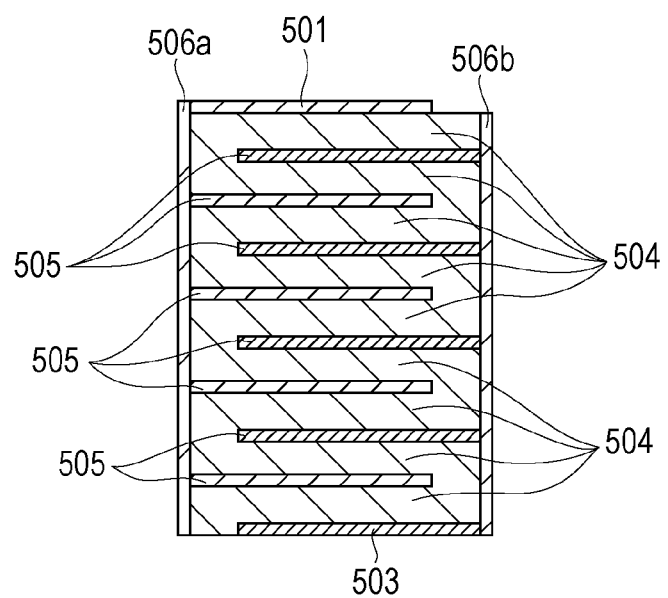

FIGS. 2A and 2B are schematic sectional views showing configurations of stacked piezoelectric elements according to embodiments of the present invention. The stacked piezoelectric element according to an embodiment of the present invention is a stacked piezoelectric element which is formed from piezoelectric material layers 54 and electrodes including internal electrodes 55 and in which piezoelectric material layers and layered electrodes are stacked alternately, wherein the above-described piezoelectric material layer 54 is made of the above-described piezoelectric material. The electrodes may include external electrodes, e.g., a first electrode 51 and a second electrode 53, besides the internal electrodes 55.

FIG. 2A shows the configuration of the stacked piezoelectric element according to an aspect of the present invention, wherein two layers of piezoelectric material layer 54 and one layer of internal electrode 55 are stacked alternately and the stacked structure is held between the first electrode 51 and the second electrode 53. However, as shown in FIG. 2B, the number of the piezoelectric material layers and the internal electrodes may be increased, and the number of layers is not limited. The stacked piezoelectric element shown in FIG. 2B has a configuration, in which nine layers of piezoelectric material layer 504 and eight layers of internal electrode 505 are stacked alternately and the stacked structure is held between a first electrode 501 and a second electrode 503, and an external electrode 506a and an external electrode 506b are included to short-circuit the internal electrodes disposed alternately.

The sizes and the shapes of the internal electrodes 55 and 505 and the external electrodes 506a and 506b are not necessarily the same as those of the piezoelectric material layers 54 and 504 and may be divided into a plurality of electrodes.

The internal electrodes 55 and 505 and the external electrodes 506a and 506b are formed from electrically conductive layers having a thickness of about 5 nm to 2,000 nm. The material therefor is not specifically limited and may be a material commonly used for the piezoelectric element. Examples may include metals, e.g., Ti, Pt, Ta, Ir, Sr, In, Sn, Au, Al, Fe, Cr, Ni, Pd, Ag, and Cu, and compounds thereof. The internal electrodes 55 and 505 and the external electrodes 506a and 506b may be made of one type thereof, be a mixture or an alloy of at least two types, or be made by stacking at least two types thereof. The plurality of electrodes may be made of materials different from each other. The internal electrodes 55 and 505 can contain at least one type of Ni and Cu from the viewpoint of inexpensive electrode material. In the case where at least one type of Ni and Cu is used for the internal electrodes 55 and 505, the stacked piezoelectric element according to an aspect of the present invention can be fired in a reducing atmosphere.

In the stacked piezoelectric element according to an aspect of the present invention, the internal electrode can contain Ag and Pd and the weight ratio M1/M2 of the weight of Ag contained (M1) to the weight of Pd contained (M2) can satisfy $1.5 \leq M1/M2 \leq 9.0$, more preferably $2.3 \leq M1/M2 \leq 4.0$. It is not desirable that the above-described weight ratio M1/M2 be less than 1.5 because the sintering temperature of the internal electrode increases. On the other hand, it is not desirable that the above-described weight ratio M1/M2 be more than 9.0 because the internal electrode becomes in the shape of an island and becomes nonuniform in the plane.

As shown in FIG. 2B, the plurality of electrodes including the internal electrodes 505 may be mutually short-circuited for the purpose of equalizing phases of drive voltages. Examples include a configuration in which the internal electrodes 505, the first electrode 501, and the second electrode 503 are short-circuited alternately. The form of short circuit between electrodes is not limited. An electrode or wiring for short-circuiting may be disposed on the side surface of the stacked piezoelectric element. Alternatively, electrodes may be mutually short-circuited by disposing a through hole penetrating the piezoelectric material layer 504 and disposing an electrically conductive material in the inside thereof.

Next, a method for manufacturing the stacked piezoelectric element by using the piezoelectric material according to an aspect of the present invention will be described.

The method for manufacturing the stacked piezoelectric element according to an aspect of the present invention includes Step (A) to produce a slurry by dispersing a metal compound powder containing at least Na, Ba, Li, Nb, Ti, and Cu, Step (B) to produce a compact from the above-described slurry, Step (C) to form an electrode on the above-described compact, and Step (D) to produce a stacked piezoelectric element by sintering a compact formed by stacking the compacts containing the above-described metal compounds and the electrodes alternately, wherein the sintering temperature in Step (D) described above is 1,200° C. or lower. The above-described metal oxide powder may contain copper. The powder in the present specification refers to a group of solid particles. The group may be a group of particles containing Ba, Na, Li, Ti, Nb, and Cu together or a group of a plurality of types of particles containing their respective elements.

Examples of metal compound powders in Step (A) described above may include Ba compounds, Na compounds, Li compounds, Ti compounds, Nb compounds, and Cu compounds.

Examples of usable Na compounds include sodium carbonate and sodium niobate.

Examples of usable Ba compounds include oxides, carbonates, oxalates, acetates, nitrates, titanates, and the like of Ba.

Examples of usable Li compounds include lithium carbonate and lithium niobate.

Examples of usable Ti compounds include titanium oxide and barium titanate.

Examples of usable Nb compounds include niobium oxide and sodium niobate. Examples of Cu compounds include copper(I) oxide, copper(II) oxide, copper carbonate, copper(II) acetate, and copper oxalate.

An example of the method for forming a slurry in Step (A) described above is shown. A solvent was added at a weight 1.6 to 1.7 times the above-described metal compound powder and mixing was performed. As for the solvent, for example, toluene, ethanol, a mixed solvent of toluene and ethanol, n-butyl acetate, and water may be used. After mixing was performed in a ball mill for 24 hours, a binder and a plasticizer are added. Examples of binders include polyvinyl alcohol (PVA), polyvinyl butyral (PVB), and acrylic resins. In the case where PVB is used as the binder, weighing was performed in such a way that the weight ratio of the solvent to PVB becomes, for example, 88:12. Examples of plasticizers include dioctyl sebacate, dioctyl phthalate, and dibutyl phthalate. In the case where dibutyl phthalate is used as the plasticizer, the weight equal to the binder is weighed. Then, the ball mill is performed for a night. The amounts of the solvent and the binder are adjusted in such a way that the viscosity of the slurry becomes 300 to 500 mPa·s.

The compact in Step (B) described above refers to a sheet-shaped mixture of the above-described metal compound powder, the binder, and the plasticizer. As for the method for obtaining the compact in Step (B) described above, for example, sheet forming is mentioned. For example, a doctor blade method may be used for the sheet forming. The doctor blade method is a method in which the above-described slurry is applied to a base material by using a doctor blade and drying is performed to form a sheet-shaped compact. For example, a PET film may be used as the above-described base material. It is desirable that a surface to be provided with the slurry of the PET film be subjected to fluorine coating because the compact is peeled easily. The drying may be air drying or hot-air drying. The thickness of the above-described compact is not specifically limited and may be adjusted in accordance with the thickness of the stacked piezoelectric element. The thickness of the compact may be increased by, for example, increasing the viscosity of the slurry.

The method for manufacturing the electrodes, that is, the internal electrodes 505 and the external electrodes 506a and 506b, in Step (C) described above is not limited. The electrodes may be formed by baking a metal paste or be formed by a sputtering method, an evaporation method, a printing method, or the like. The layer thickness and the pitch distance of the piezoelectric material layer 504 may be reduced for the purpose of decreasing the drive voltage. At that time, a stacked body including a precursor of the piezoelectric material layer 504 and the internal electrodes 505 is formed and, thereafter, a process to fire the above-described stacked body at the same time is selected. In that case, it is required that the material for the internal electrode does not cause a change in the shape and degradation in the electrical conductivity due to the temperature necessary for sintering the piezoelectric material layer 504. Metals, e.g., Ag, Pd, Au, Cu, and Ni, which have low melting points and are inexpensive as compared with Pt, or alloys thereof may be used for the internal electrodes 505 and the external electrodes 506a and 506b. However, the external electrodes 506a and 506b may be disposed after the above-described stacked body is fired. In that case, Al and carbon based electrode materials may be used in addition to Ag, Pd, Cu, and Ni.

As for the method for forming the above-described electrodes, a screen printing method is desirable. The screen printing method refers to a method in which a metal paste is applied to a compact disposed on a base material by using a spatula from above a screen printing plate placed on the compact. At least part of the above-described screen printing plate is provided with a screen mesh. Therefore, the metal paste of the portion provided with the above-described screen mesh is applied to the compact. It is desirable that the screen mesh in the above-described screen printing plate be provided with a pattern. The above-described pattern is transferred to the above-described compact by using the metal paste and, thereby, the electrode is patterned on the above-described compact.

After the electrode is formed in Step (C) described above, peeling from the base material is performed and, then, at least one of the above-described compact is stacked and contact bonded. Examples of contact-bonding methods include uniaxial pressure processing, cold hydrostatic processing, and warm hydrostatic processing. The warm hydrostatic processing is desirable because a pressure is isotropically uniformly applied. It is desirable that heating be performed to the vicinity of the glass transition temperature of the binder during contact-bonding because the contact-bonding is performed more favorably. A plurality of the above-described compacts may be stacked and contact-bonded until a predetermined thickness is reached. For example, 10 to 100 layers of the above-described compacts are stacked and, thereafter, thermocompression bonding is performed by applying a pressure of 10 to 60 MPa in the stacking direction at 50° C. to 80° C. over 10 seconds to 10 minutes so that the above-described compacts are layered. Meanwhile, a plurality of compacts may be aligned and stacked precisely by attaching alignment marks to the electrodes. As a matter of course, stacking may also be performed precisely by disposing a through hole for positioning in the compact.

In Step (D) described above, the sintering temperature is preferably 1,200° C. or lower because metals, e.g., Ag, Pd, Au, Cu, and Ni, which have low melting points and are inexpensive as compared with Pt, or alloys thereof may be used. In the case where Ni or Cu is used for the electrode, sintering in Step (D) can be performed in a reducing atmosphere.

In the method for manufacturing the stacked piezoelectric element according to an aspect of the present invention, the above-described slurry can contain a perovskite metal oxide containing at least Ba, Na, Li, Ti, Nb, and Cu. Examples of the above-described perovskite metal oxides include sodium niobate and barium titanate. The above-described slurry may contain Cu and, in that case, copper(I) oxide or copper(II) oxide may be used.

The above-described slurry can contain copper oxide because grain growth is facilitated during sintering and the density of the sintered body increases.

Liquid Ejection Head

A liquid ejection head according to an aspect of the present invention includes at least a liquid chamber provided with a vibration portion incorporated with the above-described piezoelectric element or the above-described stacked piezoelectric element and an ejection orifice communicating the above-described liquid chamber. A liquid ejected by the liquid ejection head according to an aspect of the present invention is not specifically limited insofar as the liquid is a fluid. Aqueous liquids and nonaqueous liquids, such as, water, ink, and fuel, may be ejected.

Figure 3A:
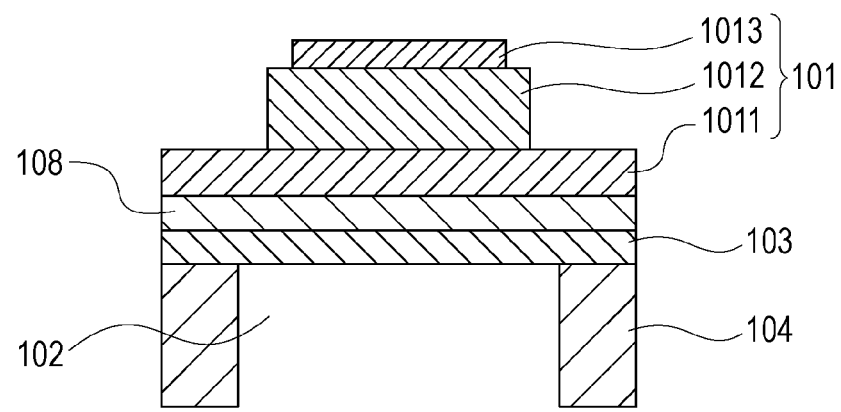
FIGS. 3A and 3B are schematic diagrams showing the configuration of a liquid ejection head according to an embodiment of the present invention.
Figure 3B:
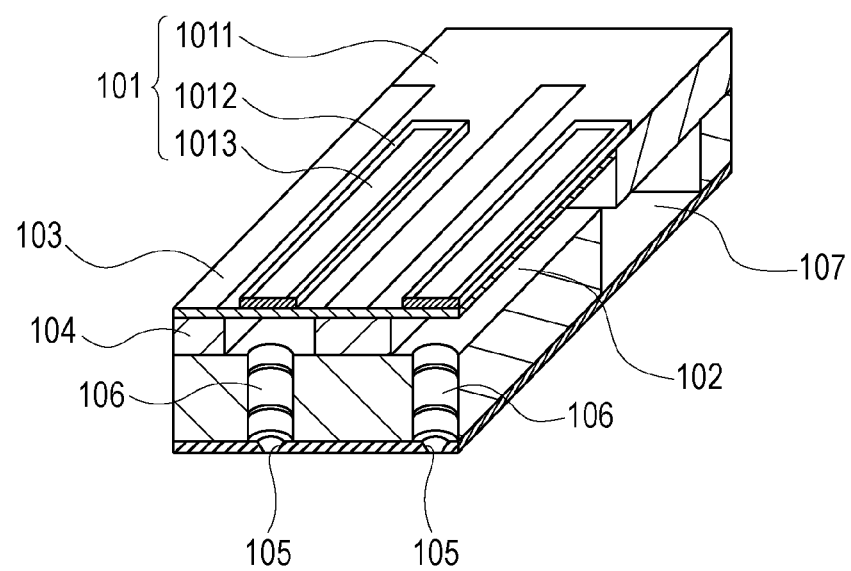

FIGS. 3A and 3B are schematic diagrams showing the configuration of a liquid ejection head according to an embodiment of the present invention. As shown in FIGS. 3A and 3B, the liquid ejection head according to an aspect of the present invention is a liquid ejection head including a piezoelectric element 101 according to an aspect of the present invention. The piezoelectric element 101 is a piezoelectric element including at least a first electrode 1011, a piezoelectric material 1012, and a second electrode 1013. As shown in FIG. 3B, the piezoelectric material 1012 is patterned, as necessary. FIG. 3B is a schematic diagram of the liquid ejection head. The liquid ejection head includes ejection orifices 105, individual liquid chambers 102, communicating holes 106 connecting the individual liquid chambers 102 and the ejection orifices 105, liquid chamber partitions 104, a common liquid chamber 107, diaphragms 103, and a piezoelectric element 101. In the drawing, the piezoelectric element 101 is rectangular, although the shape may be an ellipse, a circle, a parallelogram, or the like other than a rectangle. In general, the piezoelectric material 1012 takes on a shape along the shape of the individual liquid chamber 102.

The vicinity of the piezoelectric element 101 included in the liquid ejection head according to an aspect of the present invention will be described in detail with reference to FIG. 3A. FIG. 3A is a sectional view in the width direction of the piezoelectric element shown in FIG. 3B. The cross-sectional shape of the piezoelectric element 101 is a rectangle in the drawing, although may be a trapezoid or an inversed trapezoid.

In the drawing, the first electrode 1011 is used as a lower electrode and the second electrode 1013 is used as an upper electrode. However, the arrangement of the first electrode 1011 and the second electrode 1013 is not limited to this. For example, the first electrode 1011 may be used as the lower electrode or be used as the upper electrode. Likewise, the second electrode 1013 may be used as the upper electrode or be used as the lower electrode. Meanwhile, a buffer layer 108 may be present between the diaphragm 103 and the lower electrode. In this regard, these names are changed depending on the method for manufacturing the device, and in any case, the effects according to aspects of the present invention are obtained. In the above-described liquid ejection head, the diaphragm 103 is vertically fluctuated because of expansion and contraction of the piezoelectric material 1012 and a pressure is applied to a liquid in the individual liquid chamber 102. As a result, the liquid is ejected from the ejection orifice 105. The liquid ejection head according to an aspect of the present invention may be applied to a printer use or production of an electronic device. The thickness of the diaphragm 103 is 1.0 μm or more and 15 μm or less, and preferably 1.5 μm or more and 8 μm or less. The material for the diaphragm is not limited, but can be Si. Silicon of the diaphragm may be doped with boron or phosphorus. The buffer layer and electrode on the diaphragm may serve as part of the diaphragm. The thickness of the buffer layer 108 is 5 nm or more and 300 nm or less, and preferably 10 nm or more and 200 nm or less. The size of the ejection orifice 105 is 5 μm or more and 40 μm or less on an equivalent circle diameter basis. The shape of the ejection orifice 105 may be a circle or be the shape of a star, a square, or a triangle.

Liquid Ejection Apparatus

Next, a liquid ejection apparatus according to an aspect of the present invention will be described. The liquid ejection apparatus according to an aspect of the present invention includes a recording medium conveying portion and the above-described liquid ejection head.

Figure 4:
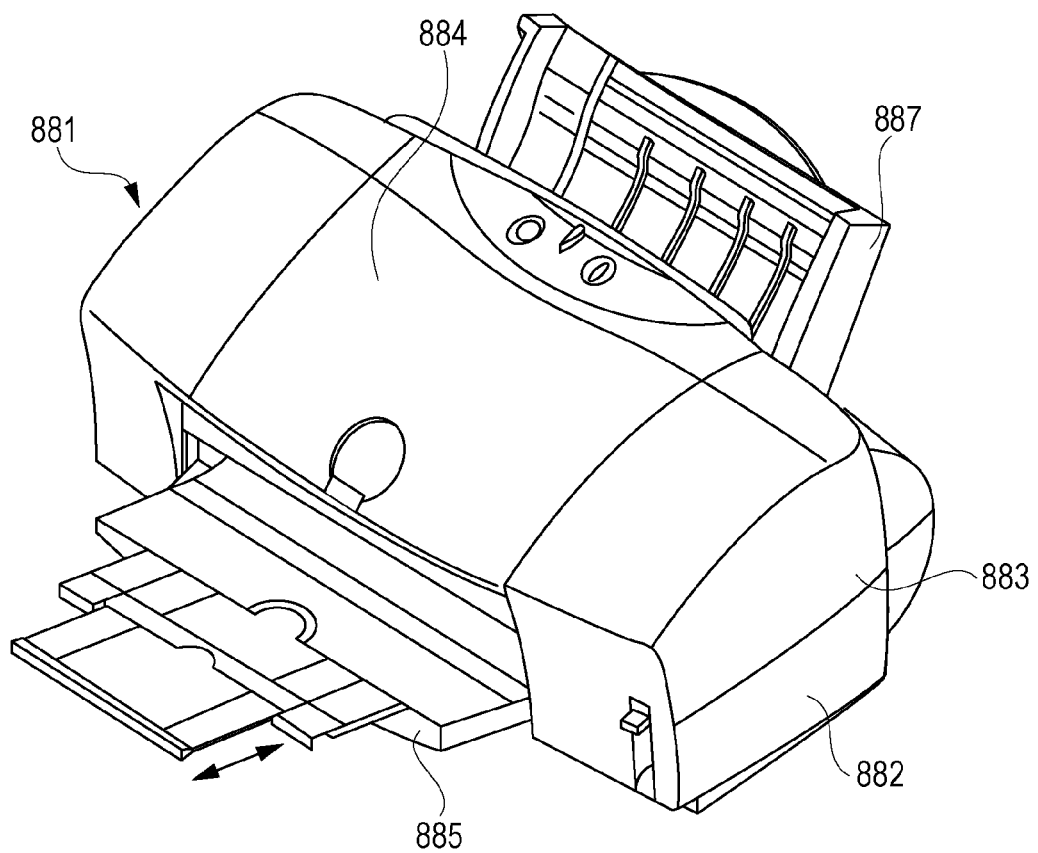
FIG. 4 is a schematic diagram showing a liquid ejection apparatus according to an embodiment of the present invention.
Figure 5:
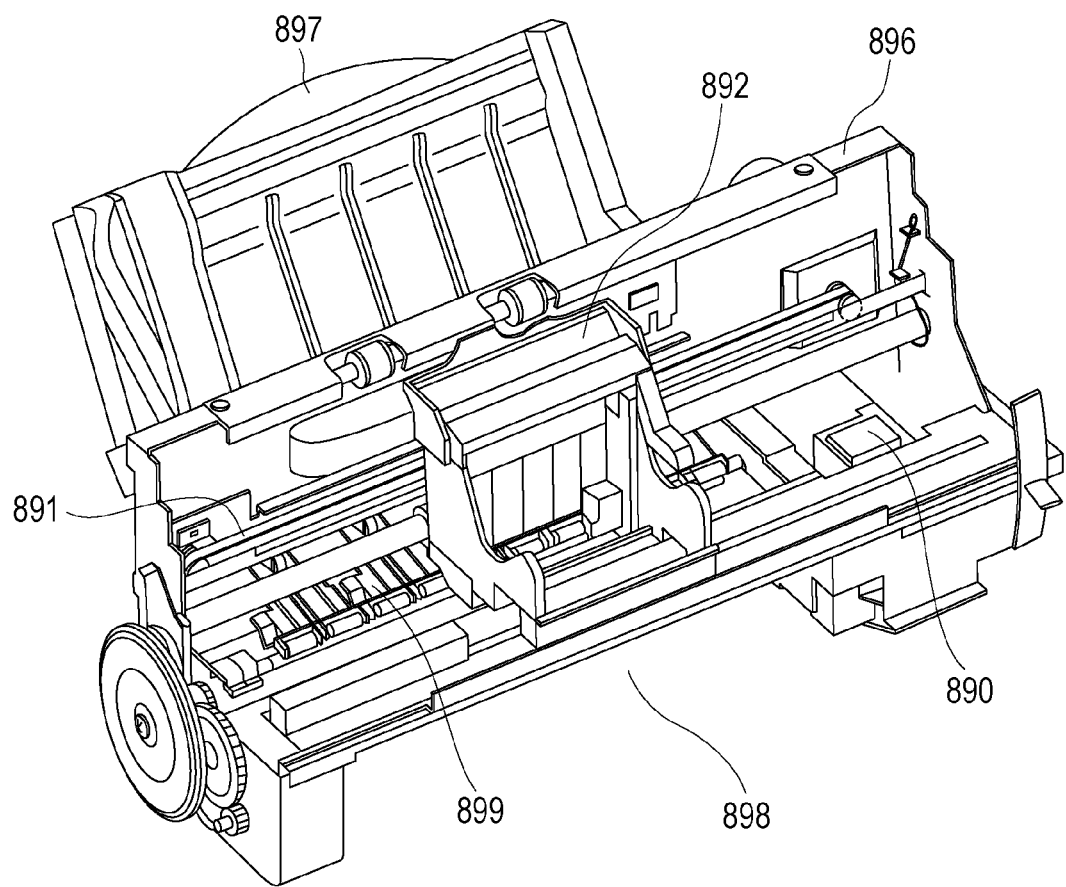
FIG. 5 is a schematic diagram showing a liquid ejection apparatus according to an embodiment of the present invention.

Examples of liquid ejection apparatuses according to an aspect of the present invention may include an ink jet recording apparatus shown in FIG. 4 and FIG. 5. FIG. 5 shows the state in which outer covers 882 to 885 and 887 of the liquid ejection apparatus (ink jet recording apparatus) 881 shown in FIG. 4 have been taken off. The ink jet recording apparatus 881 includes an automatic feeding portion 897 to automatically feeding recording paper serving as a recording medium to an apparatus main body 896. In addition, a conveying portion 899 to guide the recording paper fed from the automatic feeding portion 897 to a predetermined recording position and from the recording portion to a discharge port 898, a recording portion 891 to perform recording on the recording paper conveyed to the recording position, and a recovery portion 890 to perform a recovery treatment with respect to the recording portion 891. The recording portion 891 is provided with a carriage 892 which stores the liquid ejection head according to an aspect of the present invention and which is transferred to and fro on a rail.

In such an ink jet recording apparatus, when the carriage 892 is transferred on the rail on the basis of electric signals sent from a computer and a drive voltage is applied to the electrodes sandwiching the piezoelectric material, the piezoelectric material undergoes displacement. The individual liquid chamber 102 is pressurized by the displacement of the piezoelectric material through the diaphragm 103 shown in FIG. 3B, and the ink is ejected from the ejection orifice 105, so that printing is performed. In the liquid ejection apparatus according to an aspect of the present invention, the liquid is ejected uniformly at a high speed and it is possible to downsize the apparatus.

In the above-described example, a printer has been shown as an example. However, the liquid ejection apparatus according to an aspect of the present invention may be used as an industrial liquid ejection apparatus and an apparatus to draw on a subject, in addition to printing apparatuses, e.g., ink jet recording apparatus of facsimiles, multifunction machines, copying machines, and the like.

Ultrasonic Motor

Figure 6A:
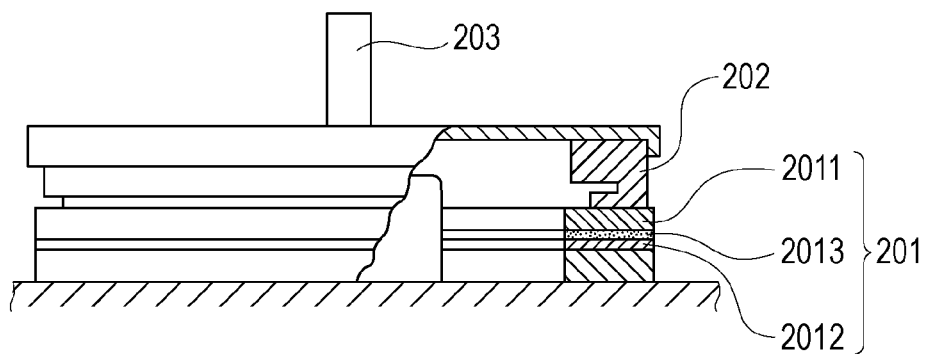
FIGS. 6A and 6B are schematic diagrams showing configurations of ultrasonic motors according to embodiments of the present invention.
Figure 6B:
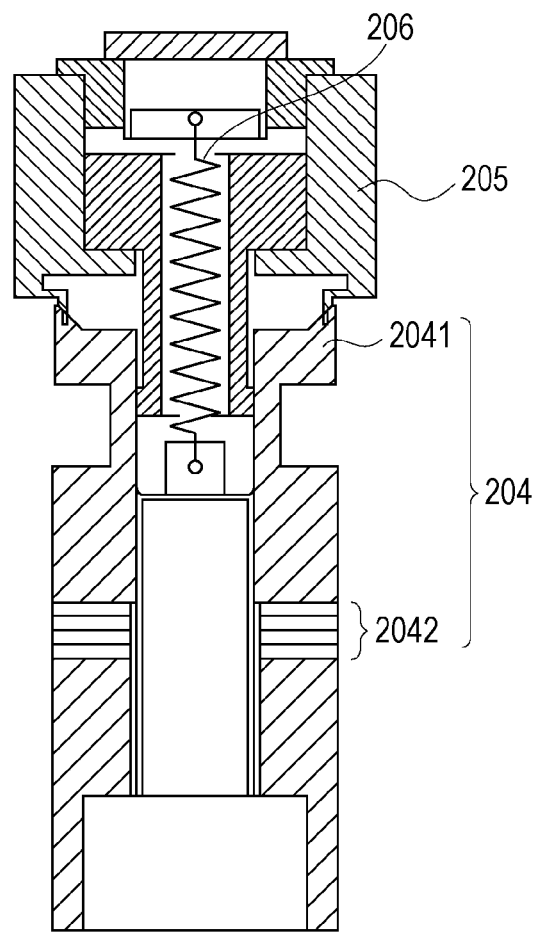

An ultrasonic motor according to an aspect of the present invention includes at least a vibration member incorporated with the above-described piezoelectric element or the above-described stacked piezoelectric element and a mobile member in contact with the above-described vibration member. FIGS. 6A and 6B are schematic diagrams showing configurations of ultrasonic motors according to embodiments of the present invention. FIG. 6A shows an ultrasonic motor in which the piezoelectric element according to an aspect of the present invention is formed from a single plate. The ultrasonic motor includes a vibrator 201, a rotor 202 in contact with a sliding surface of the vibrator 201 by a pressurization force due to a pressurization spring, although not shown in the drawing, and an output shaft 203 disposed integrally with the rotor 202. The above-described vibrator 201 is composed of a metal elastic ring 2011, the piezoelectric element 2012 according to an aspect of the present invention, and an organic adhesive 2013 (epoxy base, cyanoacrylate base, and the like) to bond the piezoelectric element 2012 to the elastic ring 2011. The piezoelectric element 2012 according to an aspect of the present invention is composed of the piezoelectric material sandwiched between the first electrode and the second electrode, although not shown in the drawing. When a two-phase alternating current voltage, in which phases are different by $\pi/2$, is applied to the piezoelectric element according to an aspect of the present invention, a flexural progressive wave is generated in the vibrator 201, and the individual points on the sliding surface of the vibrator 201 performs an elliptic motion. If the rotor 202 is in pressure-contact with the sliding surface of the vibrator 201, the rotor 202 receive a frictional force from the vibrator 201 and is rotated in the direction opposite to the flexural progressive wave. A member to be driven, although not shown in the drawing, is connected to the output shaft 203 and is driven by the torque of the rotor 202. When a voltage is applied to the piezoelectric material, the piezoelectric material is expanded or contracted because of a transversal piezoelectric effect. In the case where the elastic body, e.g., a metal, is connected to the piezoelectric element, the elastic body is bended by expansion or contraction of the piezoelectric material. The ultrasonic motor of the type described here takes advantage of this principle. Next, FIG. 6B shows an example of an ultrasonic motor including a piezoelectric element having a stacked structure. The vibrator 204 is composed of a stacked piezoelectric element 2042 sandwiched between tubular metal elastic bodies 2041. The stacked piezoelectric element 2042 is an element formed from a plurality of stacked piezoelectric materials, although not shown in the drawing, and includes a first electrode and a second electrode on the outside surface of the stacking and internal electrodes on the inside surface of the stacking. The metal elastic bodies 2041 are fixed with bolts, sandwich and fix the piezoelectric element 2042, and serve as the vibrator 204. The vibrator 204 create two vibrations orthogonal to each other by applying alternating current voltages having different phases to the piezoelectric element 2042. The two vibrations are synthesized and a circular vibration to drive the end portion of the vibrator 204 is formed. A constricted circumferential groove is disposed in the upper portion of the vibrator 204 and, thereby, the displacement of vibration for driving increases. The rotor 205 is in pressure-contact with the vibrator 204 by a spring 206 for pressurizing to obtain a frictional force for driving. The rotor 205 is rotatably supported by bearings.

Optical Apparatus

Next, an optical apparatus according to an aspect of the present invention will be described. The optical apparatus according to an aspect of the present invention includes the above-described ultrasonic motor in a drive portion.

Figure 7A:
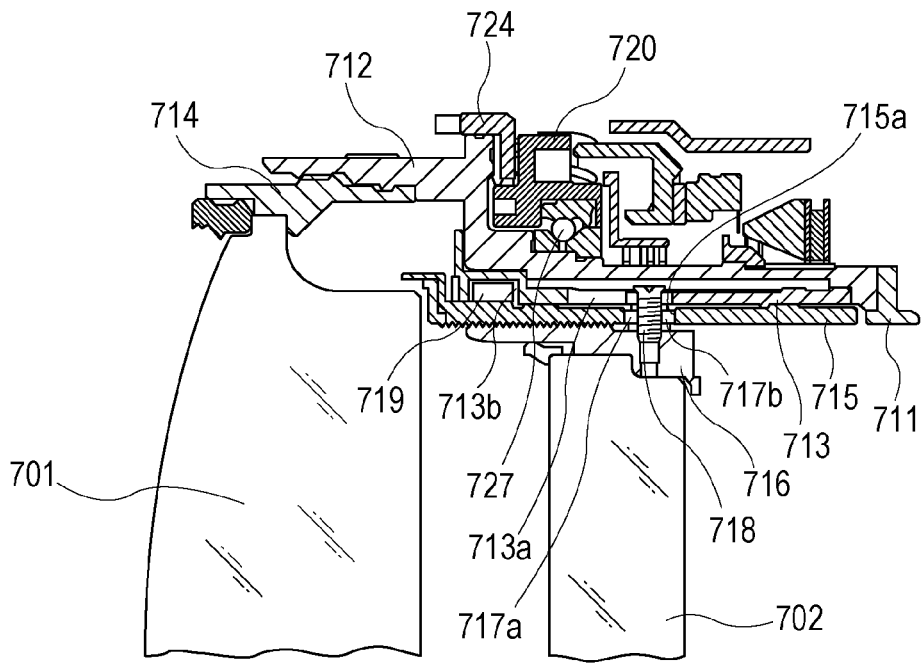
FIGS. 7A and 7B are schematic diagrams showing an optical apparatus according to an embodiment of the present invention.
Figure 7B:
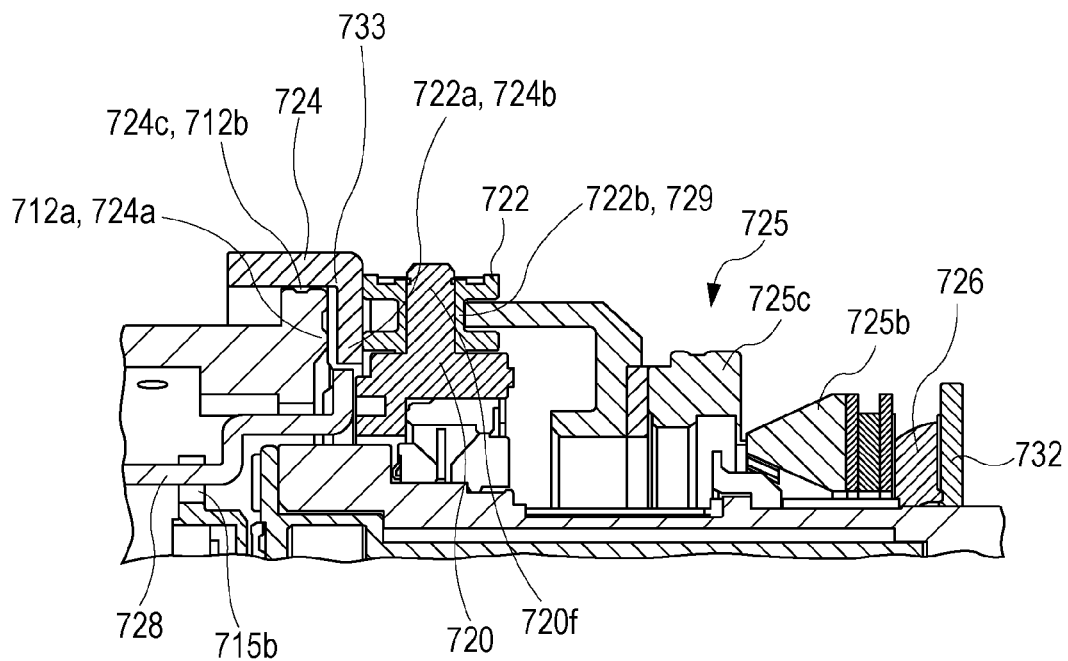
Figure 8:
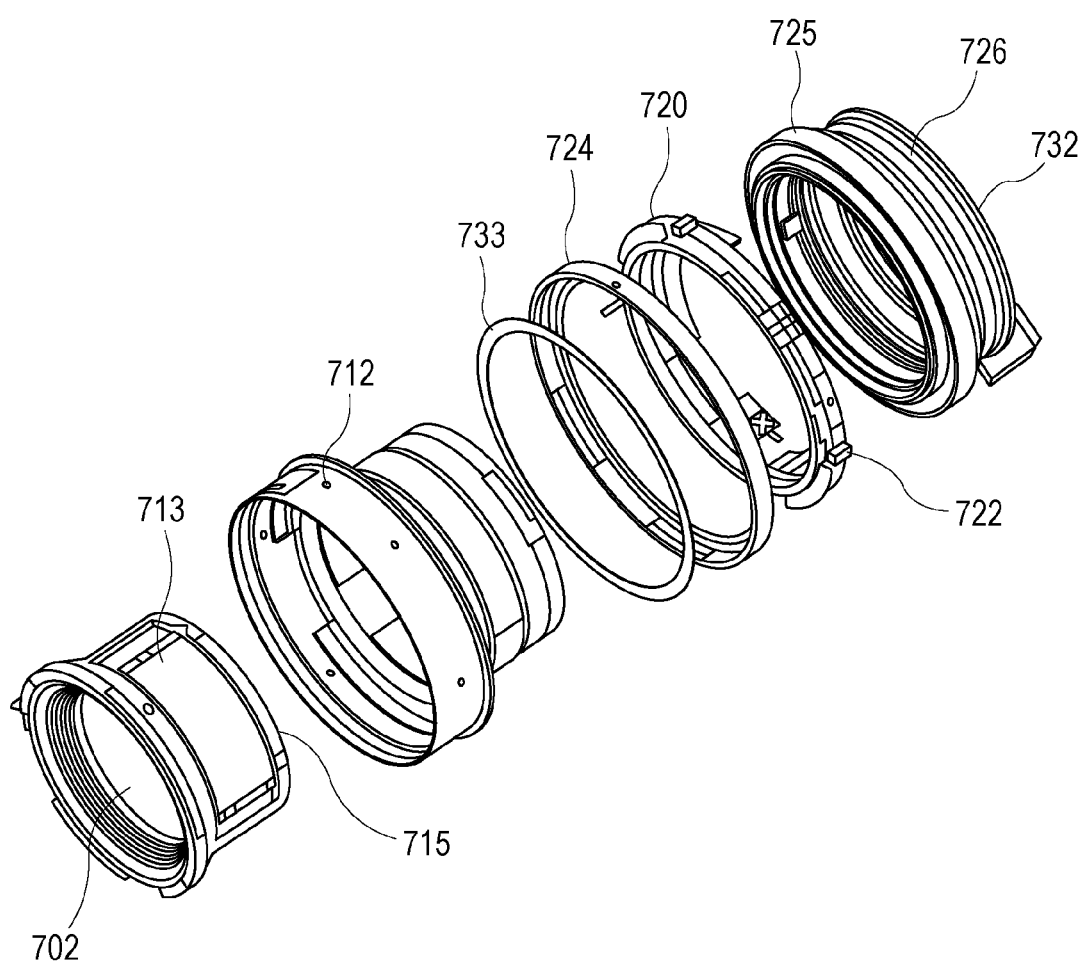
FIG. 8 is a schematic diagram showing an optical apparatus according to an embodiment of the present invention.

FIGS. 7A and 7B are key sectional views of an interchangeable lens barrel of a single-lens reflex camera which can be an example of an image pickup apparatus according to an embodiment of the present invention. FIG. 8 is an exploded perspective view of an interchangeable lens barrel of a single-lens reflex camera which can be an example of an image pickup apparatus according to an embodiment of the present invention. A fixed barrel 712, a linear guide barrel 713, and a front group barrel 714 are fixed to an attach and detach mount 711 for a camera. They are fixed members of the interchangeable lens barrel.

A linear guide groove 713a for a focus lens 702 in the optical axis direction is disposed in the linear guide barrel 713. Cam rollers 717a and 717b protruding outward in the radius direction are fixed to a rear group barrel 716 holding the focus lens 702 with a shaft screw 718, and this cam roller 717a is fit into this linear guide groove 713a.

A cam ring 715 is rotatably fit into the inner circumference of the linear guide barrel 713. Relative movement of the linear guide barrel 713 and the cam ring 715 in the optical axis direction is restricted by a roller 719, which is fixed to the cam ring 715, being fit into a circumferential groove 713b of the linear guide barrel 713. The cam ring 715 is provided with a cam groove 715a for the focus lens 702, and the above-described cam roller 717b is fit into the cam groove 715a together.

A rotation transmission ring 720 is disposed on the outer circumference side of the fixed barrel 712 while being held by a ball race 727 in such a way that rotation is possible at a fixed position with respect to the fixed barrel 712. The rotation transmission ring 720 rotatably holds a roller bearing 722 on a shaft 720f extending radially from the rotation transmission ring 720. The large-diameter portion 722a of the roller bearing 722 is in contact with a mount-side end surface 724b of a manual focus ring 724. The small-diameter portion 722b of the roller bearing 722 is in contact with a connection member 729. Six roller bearings 722 are disposed equidistantly on the outer circumference of the rotation transmission ring 720 and each roller bearing is configured to have the above-described relationship.

A low-friction sheet (washer member) 733 is disposed in the inside diameter portion of the manual focus ring 724, and this low-friction sheet is held between the mount-side end surface 712a of the fixed barrel 712 and the front-side end surface 724a of the manual focus ring 724. The outside diameter surface of the low-friction sheet 733 is specified to be in the shape of a ring and is diameter-fit into the inside diameter 724c of the manual focus ring 724. Furthermore, the outside diameter portion 712b of the fixed barrel 712 is diameter-fit into the inside diameter 724c of the manual focus ring 724. The low-friction sheet 733 plays a role in decreasing friction in a rotation ring mechanism having a configuration in which the manual focus ring 724 rotates around the optical axis relative to the fixed barrel 712.

The large-diameter portion 722a of the roller bearing 722 is in contact with the mount-side end surface 724b of the manual focus ring while a pressurization force is applied by a force of a wave washer 726 to push an ultrasonic motor 725 forward of the lens. Likewise, the small-diameter portion 722b of the roller bearing 722 is in contact with the connection portion 729 while an appropriate pressurization force is applied by a force of the wave washer 726 to push the ultrasonic motor 725 forward of the lens. A movement of the wave washer 726 in the mount direction is restricted by a washer 732 in the state of bayonet coupling with the fixed barrel 712, and a spring force (energization force) generated by the wave washer 726 is transmitted to the ultrasonic motor 725 and, furthermore, to the roller bearing 722, to serve as the force of the manual focus ring 724 to push the mount-side end surface 712a of the fixed barrel 712. That is, the manual focus ring 724 is incorporated in the state of being pushed against the mount-side end surface 712a of the fixed barrel 712 with the low-friction sheet 733 therebetween.

Therefore, when the ultrasonic motor 725 is driven to rotate with respect to the fixed barrel 712 by a control portion not shown in the drawing, the roller bearing 722 is rotated about the center of the shaft 720f because the connection member 729 is in frictional contact with the small-diameter portion 722b of the roller bearing 722. When the roller bearing 722 is rotated about the shaft 720f, as a result, the rotation transmission ring 720 is rotated about the optical axis (autofocus action).

Meanwhile, a torque about the optical axis is applied to the manual focus ring 724 from a manual operation input portion not shown in the drawing, the roller bearing 722 is rotated about the shaft 720f by a frictional force because the mount-side end surface 724b of the manual focus ring 724 is in pressure-contact with the large-diameter portion 722a of the roller bearing 722. When the large-diameter portion 722a of the roller bearing 722 is rotated about the shaft 720f, the rotation transmission ring 720 is rotated about the optical axis. At this time, the ultrasonic motor 725 is not rotated because of the friction holding force of a rotor 725c and a stator 725b (manual focus action).

Two focus keys 728 are attached to the rotation transmission ring 720 at positions opposite to each other. The focus key 728 is fit into a notch portion 715b disposed at an end portion of the cam ring 715. Therefore, when the autofocus action or the manual focus action is performed and the rotation transmission ring 720 is rotated about the optical axis, the torque thereof is transmitted to the cam ring 715 through the focus key 728. When the cam ring is rotated about the optical axis, a rear group barrel 716, the rotation of which is restricted by the cam roller 717a and the linear guide groove 713a, moves forward and backward along the cam groove 715a of the cam ring 715 by the cam roller 717b. Consequently, the focus lens 702 is driven and the focus action is performed.

Here, the interchangeable lens-barrel of a single-lens reflex camera has been explained as an optical apparatus according to an aspect of the present invention. However, it is possible to apply to optical apparatuses including an ultrasonic motor in a drive portion, e.g., compact cameras, electronic steel cameras, and personal digital assistants with cameras, regardless of the type of camera.

Vibration Apparatus and Dust Removal Apparatus

A vibration apparatus utilized for carrying, removal, and the like of particles, powders, and droplets have been used widely in electronic apparatuses.

A dust removal apparatus by using the piezoelectric element according to an aspect of the present invention will be described below as an example of the vibration apparatus according to an aspect of the present invention.

The dust removal apparatus according to an aspect of the present invention includes a vibration member incorporated with the above-described piezoelectric element or the above-described stacked piezoelectric element.

Figure 9A:
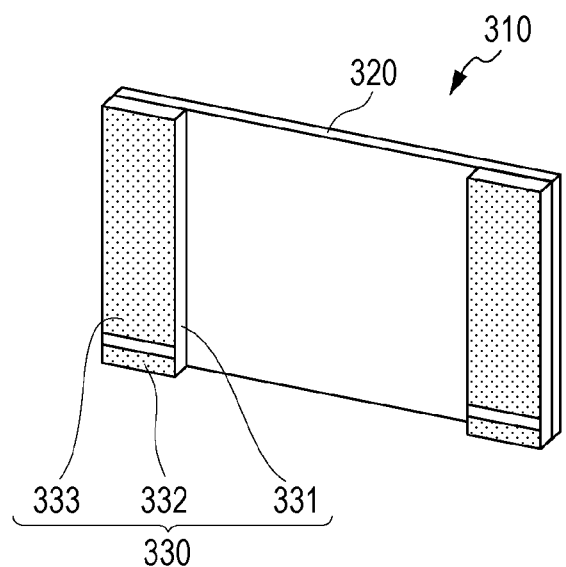
FIGS. 9A and 9B are schematic diagrams showing the case where a vibration apparatus is applied to a dust removal apparatus according to an embodiment of the present invention.
Figure 9B:
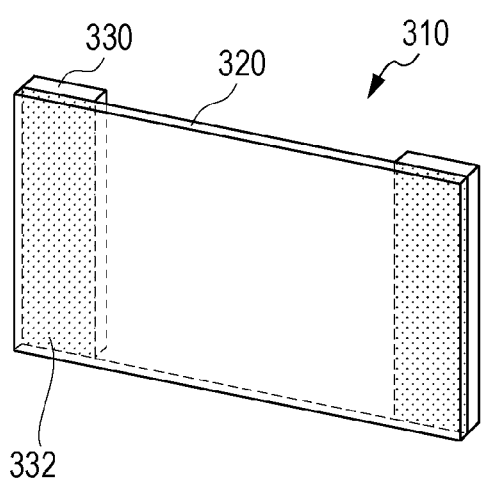

FIGS. 9A and 9B are schematic diagrams showing a dust removal apparatus according to an embodiment of the present invention. A dust removal apparatus 310 is formed from a tabular piezoelectric element 330 and a diaphragm 320. The piezoelectric element 330 may be the stacked piezoelectric element according to an aspect of the present invention. The material for the diaphragm 320 is not limited. In the case where the dust removal apparatus 310 is used for an optical device, a light-transmissive material or a light-reflective material may be used as the diaphragm 320.

Figure 10A:
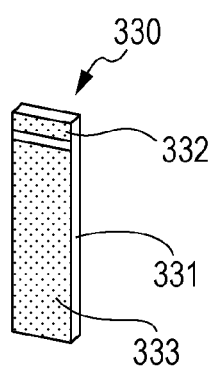
FIGS. 10A to 10C are schematic diagrams showing the configuration of a piezoelectric element in a dust removal apparatus according to an embodiment of the present invention.
Figure 10B:
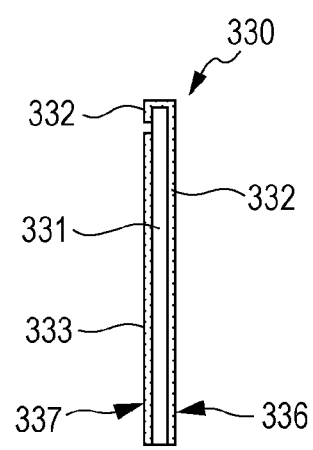
Figure 10C:
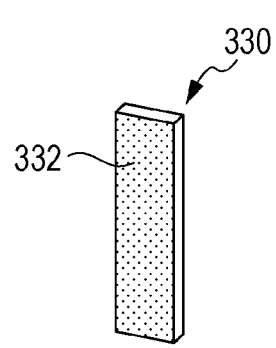

FIGS. 10A to 10C are schematic diagrams showing the configuration of the piezoelectric element 330 shown in FIGS. 9A and 9B. FIGS. 10A and 10C show configurations of the surface and the back of the piezoelectric element 330, and FIG. 10B shows the configuration of the side surface. As shown in FIG. 9A, the piezoelectric element 330 is composed of a piezoelectric material 331, a first electrode 332, and a second electrode 333, and the first electrode 332 and the second electrode 333 are disposed oppositely on the sheet surface of the piezoelectric material 331. As with FIGS. 9A and 9B, the piezoelectric element 330 may be a stacked piezoelectric element according to an aspect of the present invention. In that case, the piezoelectric material 331 has an alternate structure of piezoelectric material layers and internal electrodes, and drive waveforms having different phases on a piezoelectric material layer basis are given by short-circuiting the internal electrode and the first electrode 332 or the second electrode 333 alternately. In FIG. 10C, the surface observed in the drawing and provided with the first electrode 332 of the piezoelectric element 330 is specified to be a first electrode surface 336. In FIG. 10A, the surface observed in the drawing and provided with the second electrode 333 of the piezoelectric element 330 is specified to be a second electrode surface 337.

Here, the electrode surface in aspects of the present invention refers to the surface, on which the electrode is disposed, of the piezoelectric element. For example, as shown in FIGS. 10A to 10C, the first electrode 332 may go over to the second electrode surface 337.

As for the piezoelectric element 330 and the diaphragm 320, as shown in FIGS. 9A and 9B, the first electrode surface 336 of the piezoelectric element 330 adheres to the sheet surface of the diaphragm 320. A stress is generated between the piezoelectric element 330 and the diaphragm 320 because of driving of the piezoelectric element 330, and out-of-plane vibration is generated in the diaphragm. The dust removal apparatus 310 according to an aspect of the present invention is an apparatus to remove foreign matters, e.g., dust, attaching the surface of the diaphragm 320 by the out-of-plane vibration of the diaphragm 320. The out-of-plane vibration refers to elastic vibration which causes displacement of the diaphragm in the optical axis direction, that is, the thickness direction of the diaphragm.

Figure 11A:
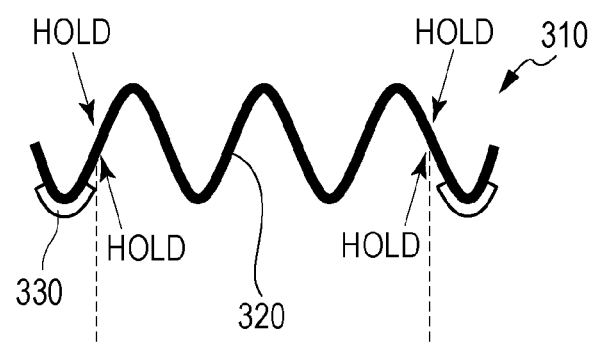
FIGS. 11A and 11B are schematic diagrams showing a principle of vibration of a dust removal apparatus according to an embodiment of the present invention.
Figure 11B:
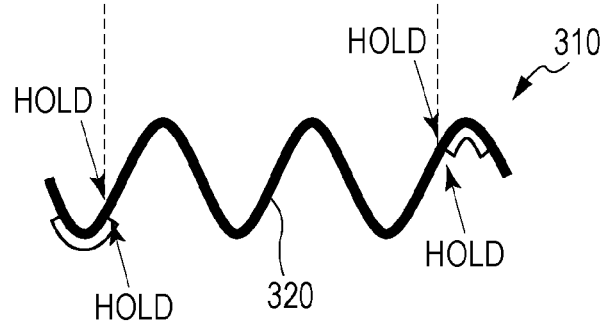

FIGS. 11A and 11B are schematic diagrams showing the principle of vibration of the dust removal apparatus 310 according to an aspect of the present invention. FIG. 11A shows a state in which alternating electric fields in the same phase were applied to a pair of right and left piezoelectric elements 330 and, thereby, out-of-plane vibration was generated in the diaphragm 320. The polarization direction of the piezoelectric material constituting the pair of right and left piezoelectric elements 330 is the same as the thickness direction of the piezoelectric element 330, and the dust removal apparatus 310 is driven in the seventh order vibration mode. FIG. 11B shows a state in which alternating electric fields in reverse phases, that is, 180° opposite phases, were applied to a pair of right and left piezoelectric elements 330 and, thereby, out-of-plane vibration was generated in the diaphragm 320. The dust removal apparatus 310 is driven in the sixth order vibration mode. The dust removal apparatus 310 according to an aspect of the present invention is an apparatus capable of effectively removing dust attaching to the surface of the diaphragm by using at least two vibration modes appropriately.

Image Pickup Apparatus

Figure 12:
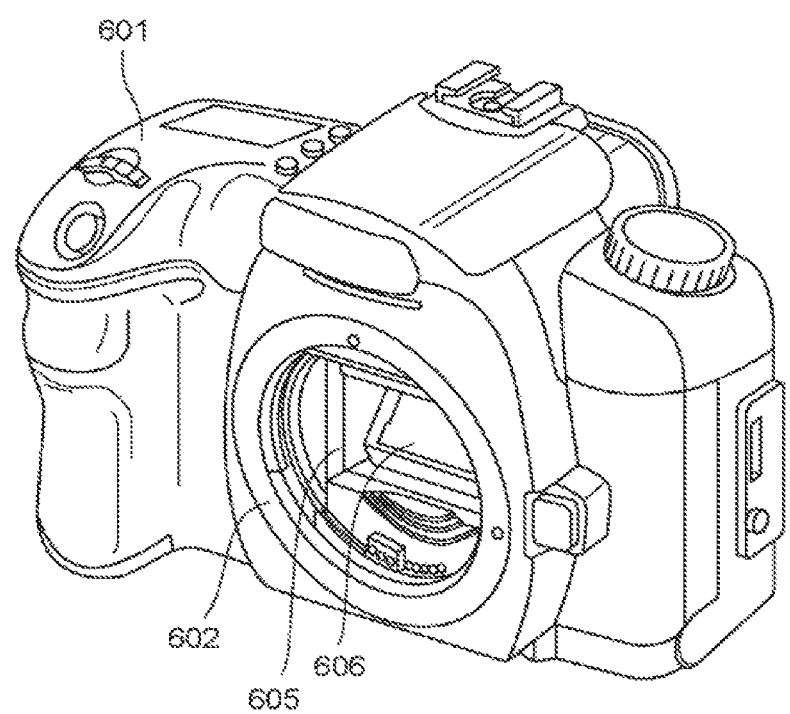
FIG. 12 is a schematic diagram showing an image pickup apparatus according to an embodiment of the present invention.
Figure 13:
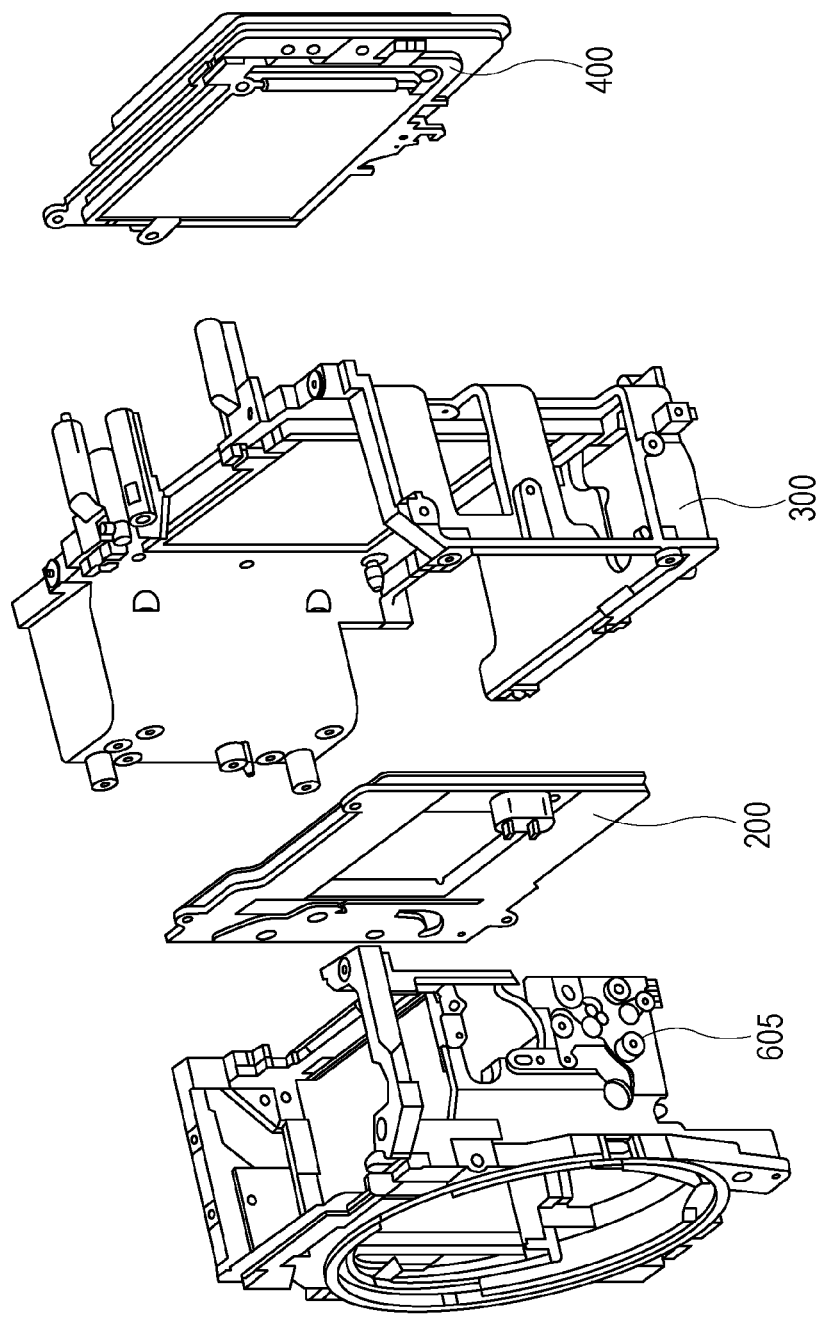
FIG. 13 is a schematic diagram showing an image pickup apparatus according to an embodiment of the present invention.

Next, an image pickup apparatus according to an aspect of the present invention will be described. The image pickup apparatus according to an aspect of the present invention is an image pickup apparatus including at least the above-described dust removal apparatus and an image pickup element unit, wherein a vibration member of the above-described dust removal apparatus and a light receiving surface of the above-described image pickup element unit are disposed on the same axis sequentially. FIG. 12 and FIG. 13 are diagrams showing a digital single-lens reflex camera which is an example of an image pickup apparatus according to a favorable embodiment of the present invention.

FIG. 12 is a front side perspective view of a camera main body 601 viewed from an object side and shows the state in which an photographing lens unit are taken off. FIG. 13 is an exploded perspective view showing a rough configuration of the inside of a camera for the purpose of illustrating the structures around the dust removal apparatus according to an aspect of the present invention and an image pickup element unit 400.

In the camera main body 601, a mirror box 605, to which an photographing light bundle passed through an photographing lens is led, is disposed and a main mirror (quick return mirror) 606 is disposed in the mirror box 605. The main mirror 606 comes into the state in which the angle is kept at 45° with respect to the photographing optical axis to lead the photographing light bundle to the direction of a penta daha mirror (not shown in the drawing) or the state of being held at the position taking shelter from an photographing light bundle to lead the photographing light bundle to the direction of image pickup element (not shown in the drawing).

The mirror box 605 and a shutter unit 200 are disposed on the object side of a main body chassis 300 serving as a skeleton of the camera main body sequentially from the object side. An image pickup element unit 400 is disposed on the photographer side of the main body chassis 300. The image pickup element unit 400 is disposed while being adjusted in such a way that an image pickup surface of the image pickup element is arranged at a predetermined distance from and parallel to an attaching surface of a mount portion 602 serving as a reference of attachment of the photographing lens unit.

Here, the digital single-lens reflex camera has been explained as an example of the image pickup apparatus according to an aspect of the present invention. However, for example, a photographing lens unit interchange type camera, such as, a mirrorless digital single-lens camera not provided with a mirror box 605, may be employed. It may also be applied particularly to an apparatus required to remove dust adhering to the surface of an optical component among photographing lens unit interchange type video cameras, various image pickup apparatuses, e.g., copying machines, facsimiles, and scanners, and electronic and electric apparatuses with image pickup apparatuses.

Electronic Apparatus

Next, an electronic apparatus according to an aspect of the present invention will be described. The electronic apparatus according to an aspect of the present invention is incorporated with a piezoelectric acoustic component provided with the above-described piezoelectric element or the above-described stacked piezoelectric element. The piezoelectric acoustic component includes a speaker, a buzzer, a microphone, and a surface acoustic wave (SAW) element.

Figure 14:
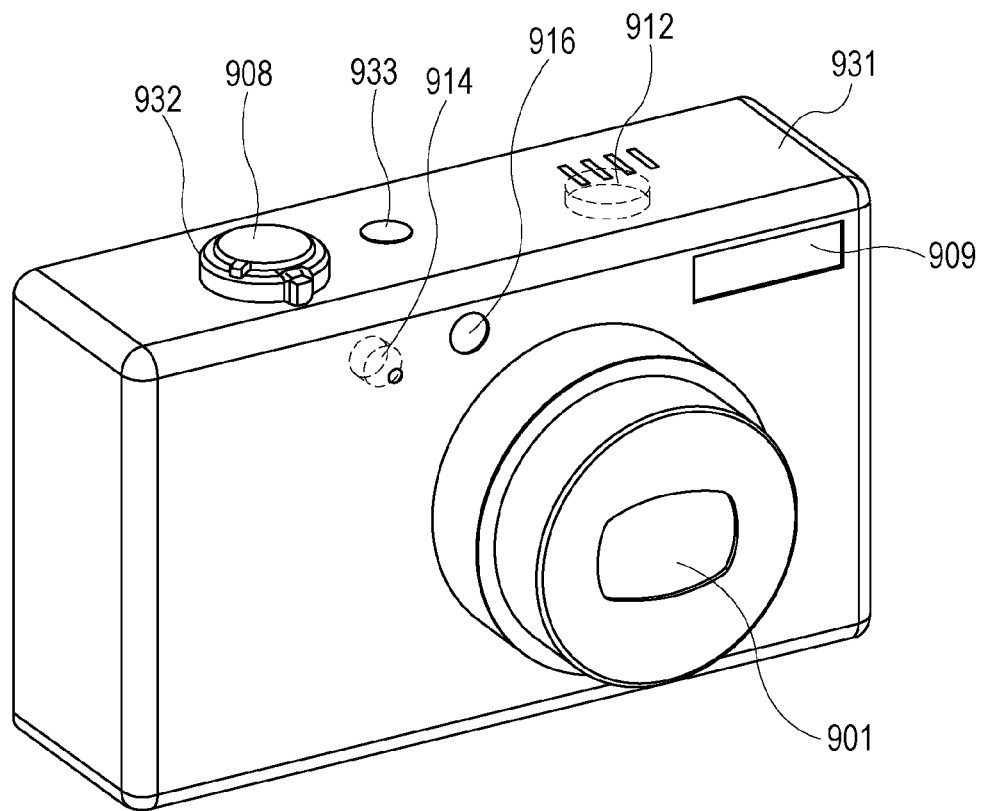
FIG. 14 is a schematic diagram showing an electronic apparatus according to an embodiment of the present invention.

FIG. 14 is an entire perspective view of a main body 931 of a digital camera which is an example of the electronic apparatus according to a favorable embodiment of the present invention, viewed from the front. An optical apparatus 901, a microphone 914, a strobe light emission portion 909, and a fill light portion 916 are disposed on the front surface of the main body 931. The microphone 914 is incorporated in the inside of the main body and, therefore, is indicated by a broken line. A shape with a hole to pick up a sound from the outside is disposed forward of the microphone 914.

A power source button 933, a speaker 912, a zoom lever 932, and a release button 908 to take a focusing action are disposed on the upper surface of the main body 931. The speaker 912 is incorporated in the inside of the main body 931 and is indicated by a broken line. A shape with holes to transmit a sound to the outside is disposed forward of the speaker 912.

The piezoelectric acoustic component according to an aspect of the present invention is used for at least one of the microphone 914, the speaker 912, or the surface acoustic wave element.

Here, the digital camera has been explained as an example of the electronic apparatus according to an aspect of the present invention. However, the electronic apparatus according to an aspect of the present invention may also be applied to electronic apparatuses including various piezoelectric acoustic components, for example, sound-reproducing apparatuses, sound-recording apparatuses, cellular phones, and information terminals.

As described above, the piezoelectric element and the stacked piezoelectric element according to aspects of the present invention can be used for the liquid-ejection head, the liquid-ejection apparatus, the ultrasonic motor, the optical apparatus, the vibration apparatus, the dust removal apparatus, the image pickup apparatus, and the electronic apparatus. In the case where the piezoelectric element and the stacked piezoelectric element according to aspects of the present invention are used, a liquid ejection head having a nozzle density and an ejection speed which are higher than or equal to those in the case where a piezoelectric element containing lead is used is provided.

In the case where the liquid ejection head according to an aspect of the present invention is used, a liquid ejection apparatus having an ejection speed and ejection accuracy higher than or equal to those in the case where a piezoelectric element containing lead is used is provided. In the case where the piezoelectric element and the stacked piezoelectric element according to aspects of the present invention are used, an ultrasonic motor having a driving force and the durability which are higher than or equal to those in the case where a piezoelectric element containing lead is used is provided.

In the case where the ultrasonic motor according to an aspect of the present invention is used, an optical apparatus having the durability and the action accuracy which are higher than or equal to those in the case where a piezoelectric element containing lead is used is provided.

In the case where the piezoelectric element and the stacked piezoelectric element according to aspects of the present invention are used, a vibration apparatus having the vibration performance and the durability which are higher than or equal to those in the case where a piezoelectric element containing lead is used is provided.

In the case where the vibration apparatus according to an aspect of the present invention is used, a dust removal apparatus having a dust removal efficiency and the durability which are higher than or equal to those in the case where a piezoelectric element containing lead is used is provided.

In the case where the dust removal apparatus according to an aspect of the present invention is used, an image pickup apparatus having a dust removal function higher than or equal to that in the case where a piezoelectric element containing lead is used is provided.

In the case where the piezoelectric acoustic component including the piezoelectric element or the stacked piezoelectric element according to an aspect of the present invention is used, an electronic apparatus having the sound generation performance higher than or equal to that in the case where a piezoelectric element containing lead is used is provided.

The piezoelectric material according to an aspect of the present invention may be used for devices, e.g., ultrasonic vibrators, piezoelectric actuators, piezoelectric sensors, and ferroelectric memories, in addition to liquid ejection heads, motors, and the like.

EXAMPLES

The piezoelectric material according to an aspect of the present invention will be more specifically described below with reference to examples, although the present invention is not limited to the following examples.

Table 1 shows the compositions and properties of sintered bodies in Examples 1 to 22 and Comparative examples 1 to 10 according to aspects of the present invention. Table 2 shows the resistivities and properties determined on the basis of the resonance-antiresonance measurement of the sintered bodies in Comparative example 2 and Examples 1 to 4.

TABLE 1

|  | x | y | x/y | z | Cu (mol %) | Curie temperature (° C.) | Relative density (%) | Piezoelectric constant $o_{33}$ (pC/N) | Tungsten bronze structure |
|---|---|---|---|---|---|---|---|---|---|
| Comparative example 1 | 0.92 | 0.91 | 1.01 | 0.01 | 0.50 | 250 | 91 | — | not detected |
| Comparative example 2 | 0.87-.089 | 0.91 | 0.96-0.98 | 0.01 | 0.00 | 250 | 92 | 121 | not detected |
| Comparative example 3 | 0.87-.089 | 0.91 | 0.96-0.98 | 0.01 | 0.03 | 250 | 92 | 119 | not detected |
| Example 1 | 0.87-.089 | 0.91 | 0.96-0.99 | 0.01 | 0.30 | 250 | 96 | 152 | not detected |
| Example 2 | 0.87-.089 | 0.91 | 0.96-0.99 | 0.01 | 0.50 | 250 | 95 | 156 | not detected |
| Example 3 | 0.87-.089 | 0.91 | 0.96-0.99 | 0.01 | 0.75 | 250 | 94 | 153 | not detected |
| Example 4 | 0.87-.089 | 0.91 | 0.96-0.99 | 0.01 | 2.00 | 250 | 96 | 150 | not detected |

TABLE 1-continued

| | x | y | x/y | z | Cu (mol %) | Curie temperature (° C.) | Relative density (%) | Piezoelectric constant $o_{33}$ (pC/N) | Tungsten bronze structure |
|---|---|---|---|---|---|---|---|---|---|
| Comparative example 4 | 0.87-.089 | 0.91 | 0.96-0.99 | 0.01 | 2.50 | 250 | 92 | 128 | not detected |
| Comparative example 5 | 0.85-0.88 | 0.89 | 0.96-0.99 | 0.01 | 0.00 | 230 | 89 | 114 | not detected |
| Example 5 | 0.85-0.88 | 0.89 | 0.96-0.99 | 0.01 | 0.50 | 230 | 95 | 164 | not detected |
| Example 6 | 0.83-0.85 | 0.86 | 0.96-0.99 | 0.01 | 0.50 | 190 | 96 | 161 | not detected |
| Example 7 | 0.81-0.83 | 0.84 | 0.96-0.99 | 0.01 | 0.50 | 150 | 96 | 115 | not detected |
| Example 8 | 0.78-0.90 | 0.81 | 0.96-0.99 | 0.02 | 0.50 | 100 | 96 | 101 | not detected |
| Comparative example 6 | 0.88-0.92 | 0.93 | 0.95-0.99 | 0.03 | 0.00 | 290 | 91 | 81 | not detected |
| Example 9 | 0.88-0.92 | 0.93 | 0.95-0.99 | 0.03 | 0.50 | 290 | 96 | 90 | not detected |
| Example 10 | 0.86-0.90 | 0.91 | 0.95-0.99 | 0.03 | 0.50 | 270 | 96 | 87 | not detected |
| Example 11 | 0.84-0.87 | 0.88 | 0.95-0.99 | 0.03 | 0.50 | 220 | 96 | 103 | not detected |
| Example 12 | 0.81-0.85 | 0.85 | 0.95-0.99 | 0.03 | 0.50 | 170 | 96 | 128 | not detected |
| Example 13 | 0.79-0.82 | 0.83 | 0.95-0.99 | 0.03 | 0.50 | 120 | 96 | 122 | not detected |
| Example 14 | 0.76-0.79 | 0.80 | 0.95-0.99 | 0.03 | 0.50 | 90 | 96 | 120 | not detected |
| Comparative example 7 | 0.69-0.72 | 0.73 | 0.95-0.99 | 0.03 | 0.50 | 10 | 95 | — | not detected |
| Example 15 | 0.88-0.93 | 0.95 | 0.93-0.98 | 0.05 | 0.50 | 350 | 96 | 54 | not detected |
| Example 16 | 0.86-0.92 | 0.94 | 0.92-0.98 | 0.06 | 0.50 | 330 | 95 | — | detected |
| Example 17 | 0.83-0.88 | 0.90 | 0.92-0.98 | 0.06 | 0.50 | 280 | 94 | 78 | detected |
| Example 18 | 0.78-0.83 | 0.85 | 0.92-0.98 | 0.06 | 0.50 | 180 | 94 | 90 | detected |
| Example 19 | 0.74-0.78 | 0.80 | 0.92-0.98 | 0.06 | 0.50 | 110 | 93 | 76 | detected |
| Example 20 | 0.81-0.88 | 0.90 | 0.90-0.98 | 0.08 | 0.50 | 300 | 93 | — | detected |
| Comparative example 8 | 0.86-0.95 | 0.97 | 0.89-0.98 | 0.09 | 0.00 | 310 | 91 | 23 | not detected |
| Example 21 | 0.86-0.95 | 0.97 | 0.89-0.98 | 0.09 | 0.50 | 310 | 96 | 48 | not detected |
| Example 22 | 0.78-0.88 | 0.90 | 0.87-0.98 | 0.11 | 0.50 | 360 | 93 | — | detected |
| Comparative example 9 | 0.87-0.98 | 1.00 | 0.87-0.98 | 0.15 | 0.50 | 330 | 94 | 45 | not detected |
| Comparative example 10 | 0.85-0.96 | 0.98 | 0.87-0.98 | 0.15 | 0.50 | 320 | 93 | 46 | not detected |

TABLE 2

| | Amount of addition of Cu (mol %) | Resistivity (GΩcm) | Young's modulus $Y_{11}$ (GPa) | Electromechanical coupling coefficient $k_{31}$(−) | Piezoelectric constant $|d_{31}|$ (pm/V) | Mechanical quality factor Qm (−) |
|---|---|---|---|---|---|---|
| Comparative example 2 | 0.00 | 34 | 118 | 0.092 | 23.7 | 365 |
| Example 1 | 0.30 | 756 | 142 | 0.197 | 47.3 | 621 |
| Example 2 | 0.50 | 739 | 141 | 0.198 | 46.9 | 610 |
| Example 3 | 0.75 | 663 | 140 | 0.193 | 50.6 | 653 |
| Example 4 | 2.00 | 231 | 136 | 0.165 | 45.4 | 503 |

As for raw materials, powders of sodium niobate ($NaNbO_3$), barium titanate ($BaTiO_3$), lithium carbonate ($Li_2CO_3$), niobium oxide ($Nb_2O_5$), and copper oxide (Cu(II)O) were used. The raw material powders were mixed for 12 hours in a ball mill.

The mixed powder was calcined at 900° C. to 1,100° C. in the air over 2 to 5 hours. The calcined powder was pulverized and granulated by adding 3 percent by weight of PVB binder relative to the weight of the calcined powder. The granulated powder was filled into a mold and was compressed by a pressure of 200 MPa, so that a compact having a diameter of 17 mm and a thickness of about 1 mm was produced. The resulting compact was fired at 1,150° C. to 1,250° C. in the air for 2 to 6 hours and, thereby, a sintered body was obtained.

In the case where Cu is not contained, calcination at a temperature of 1,000° C. to 1,050° C. was necessary to form a solid solution through reaction of the raw material powders. As for a sample including Cu, the reaction of the raw material powders started at 900° C. to 1,000° C., and a solid solution was formed.

The density of the sintered body was measured by an Archimedes method.

The sintered body was ground in such a way that the thickness became about 0.5 mm. X-ray diffraction was performed using the ground sintered body or a powder produced by pulverizing the ground sintered body and, thereby, constituent phases and the lattice constant were evaluated.

According to the evaluation of the composition of the sintered body by inductively coupled plasma emission spectroscopy (ICP), in all samples excluding Comparative example 1, each of the ratio (Na+Li)/Nb of the number of moles of Na and Li to the number of moles of Nb was smaller than 1. The Cu content was small and, therefore, the value described in Table 1 includes±50% of measurement error. The grain size in the sintered body was evaluated on the basis of observation with an optical microscope or electronic microscope.

Piezoelectric elements of Examples 1 to 22 and Comparative examples 1 to 10 were produced for the evaluation of electric characteristics, e.g., the piezoelectric characteristics and the insulation resistance. In order to remove the stress in the ground sintered body and organic components on the surface, a heat treatment was performed at 400° C. to 500° C. in the air for 30 minutes. Gold electrodes having a thickness of 400 nm were formed on both the surface and the back of a disc-shaped ceramic by a DC sputtering method. A film of 30 nm of Ti serving as an adhesion layer was formed between the electrode and the ceramic. The resulting ceramic with the electrodes was cut to produce a strip piezoelectric element of 10 mm×2.5 mm×0.5 mmt.

A semiconductor parameter analyzer was used for evaluation of the resistivity. Several ten volts to 100 V of direct current voltage was applied to the sample, and the resistance 30 seconds after start of application of the voltage was measured. The resistivity was calculated on the basis of the measured resistance and the sample dimension.

The sample was subjected to a polarization treatment to evaluate the piezoelectric characteristics. Specifically, a voltage of 1.5 to 5 kV/mm was applied to the sample for 30 minutes in an oil bath kept at 80° C. to 150° C., and cooling to room temperature was performed while the voltage was applied. In Comparative example 1, where x>y holds good, the insulation resistance was low and the polarization treatment was not able to be performed.

The Young's modulus ($Y_{11}$), the electromechanical coupling coefficient ($k_{31}$), the piezoelectric constant ($d_{31}$), and the mechanical quality factor (Qm) of the strip $d_{31}$ element were measured by the resonance-antiresonance method. The piezoelectric constant ($d_{33}$) was evaluated with a $d_{33}$ meter on the principle of a Berlin court method by using the same sample. The Curie temperature and the successive phase transition temperature were determined by measuring the temperature dependence of the relative dielectric constant. In the measurement of temperature dependence of the relative dielectric constant, changes in the relative dielectric constant were recorded, where the sample was cooled once from room temperature to −100° C. and, thereafter, the temperature was raised to 400° C. The Curie temperature and the successive phase transition temperature were calculated on the basis of the local maximum portion of the relative dielectric constant. An impedance analyzer was used for the measurement of the relative dielectric constant. The measurement frequency was 1 kHz and the magnitude of the applied alternating current electric field was specified to be 500 mV.

The polarization-electric field hysteresis measurement was performed before and after the polarization treatment. Specifically, the amount of polarization was measured when an alternating current electric field (triangle wave) of 10 Hz was applied to the piezoelectric element according to an aspect of the present invention. The material exhibiting ferroelectricity in a certain temperature region has piezoelectricity in the same temperature region and may also be used as a material for ferroelectric memory on the basis of switching of spontaneous polarization as an action principle. Presence or absence of ferroelectricity, the magnitude of spontaneous polarization related to the piezoelectric constant (including the extent of pinning of spontaneous polarization), and the magnitude of coercive electric field may be evaluated on the basis of the polarization-electric field hysteresis loop measurement.

The relative densities of sintered bodies in Examples and Comparative examples were 89% to 96%. When comparisons were made between samples having the same ratio of $NaNbO_3$, $BaTiO_3$, and $LiNbO_3$ components, the relative densities of the samples containing Li and Cu in Examples were higher than those of samples containing Li and not containing Cu in Comparative examples. Even when $LiNbO_3$ was contained, high relative densities of 93% or more were obtained because Cu was contained. When Cu was contained, the sample having a relative density 6%, at maximum, higher than that of the sample not containing Cu was able to be produced. This high density is a value not described in NPLs 1 and 2. The values of Curie temperature were not changed significantly depending on presence or absence of Cu. According to NPL 2, the values of the relative density, $d_{33}$, and Qm continue to increase until the amount of addition of Cu reaches 0.3 percent by mole, but 0.3 percent by mole is a peak, and when the amount of addition is more than that, the characteristics are reduced sharply. Therefore, the characteristics exhibit peaky changes with respect to the amount of addition, so that there is an anxiety from the viewpoint of industrial productivity in which the quality is maintained stably.

Meanwhile, as is described in the above-described Tables 1 and 2, according to the data (Comparative examples 1 to 3 and Examples 1 to 4) where the amount of Li was specified to be constant (1%) and the amount of addition of Cu was changed, the relative density, $d_{33}$, Qm, and $d_{31}$ maintained high values until the amount of addition of Cu reached 2%. That is, it is understood that the characteristics were stabilized at high levels in a wide range of the amount of addition of Cu because Li and C were contained together and, thereby, the piezoelectric materials in the present examples were advantageous from the viewpoint of the industrial productivity.

As for the relative density, according to the description in NPL 2, the relative density of NN-BT-Cu shown in FIG. 2 is between 90% and 91.5%. In this regard, according to Table 1, the relative densities of samples, to which only Li was added, in Comparative examples 1 to 3 were 91% to 92% and were equivalent to NPL 2. On the other hand, it is clear that the relative densities of the piezoelectric materials, to which appropriate amounts of Li and Cu were added, in the present examples were a high 94% to 96%.

The grain size of the sintered body was within the range of 2 to 50 μm on the basis of observation with an electronic microscope. The grain size was within the range of 2 to 30 μm in the region where the $LiNbO_3$ component was less than 5%.

The distribution of Cu in the sintered body was examined by energy dispersive X-ray spectroscopy. As a result, it was ascertained that part of Cu was present in grains. However, most of Cu was present at grain boundaries between the individual grains. The lattice constants of samples having different Cu contents were evaluated by X-ray diffraction (Comparative example 2, Examples 1 to 4). The lattice constants were almost constant with respect to the Cu contents. In addition, the crystal system was not changed by presence or absence of Cu. These results indicate that most of Cu is present at grain boundaries and Cu is not taken into a crystal lattice to a large extent.

As shown in Table 2, when 0.3 percent by mole or more of Cu was contained in a ternary system of $NaNbO_3$—$BaTiO_3$—$LiNbO_3$, the resistivity and the mechanical quality factor were improved. The resistivity and the mechanical quality factor did not take on sharp local maximum values at a specific Cu content and maintained high values until the Cu content reached 2 percent by mole. Consequently, it is clear that there is an advantage from the viewpoint of stable industrial productivity as well.

As for the value of the mechanical quality factor Qm, as is clear from Table 2 described above, the value of Qm of Comparative example 2 in which Cu was not contained was 365. When Cu was added, the value of Qm increased to 503 to 653 (Examples 1 to 4).

The effect of Cu was not ascertained with respect to the sample having a Cu content of 0.03 percent by mole (Comparative example 3). As for the sample having a Cu content of 2.5 percent by mole, the density and the piezoelectricity were reduced (Comparative example 4). In Comparative example 7 in which y was smaller than 0.75, the Curie temperature was lower than room temperature. In Comparative example 9 in which y was 1 and in Comparative example 10 in which z was 0.15 or more, the piezoelectric constants $d_{33}$ were lower than those in Examples according to the present invention.

In part of region in which the amount of $LiNbO_3$ content was more than about 5%, an impurity phase having the tungsten bronze structure was detected by the X-ray diffraction measurement regardless of presence or absence of Cu. Even the sample, from which the impurity phase having the tungsten bronze structure was detected, was able to be subjected to the polarization treatment and a measurement of piezoelectricity.

Figure 15:
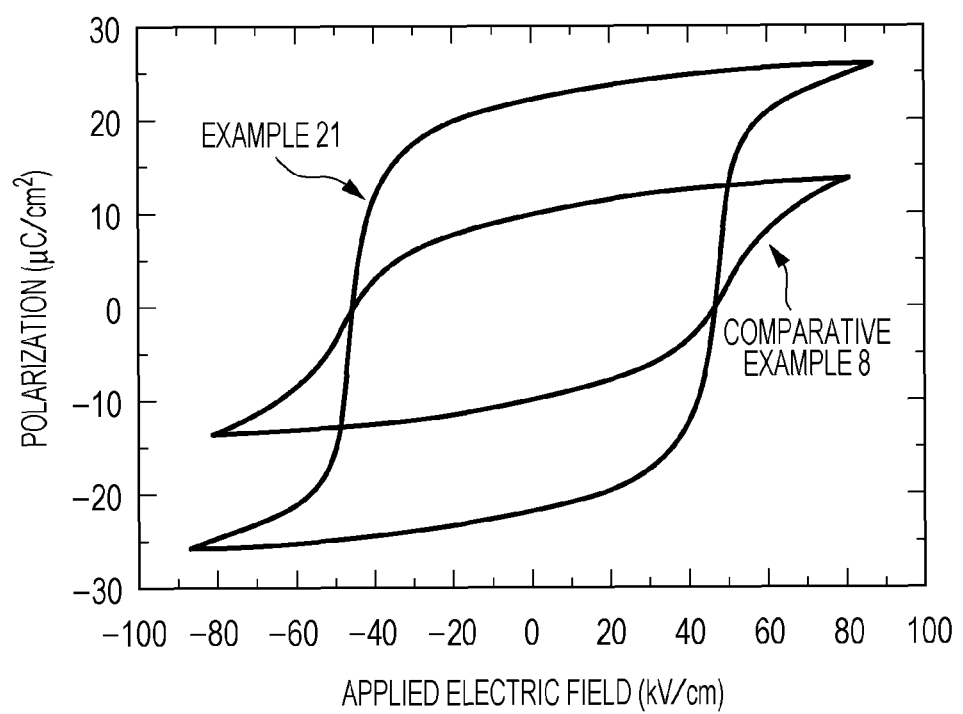
FIG. 15 shows polarization-electric field hysteresis loops of sintered bodies in Comparative example 8 and Example 21 according to an embodiment of the present invention.

FIG. 15 shows polarization-electric field hysteresis curves of Example 21 and Comparative example 8 measured after polarization. The sample containing Cu exhibited remanent polarization value larger than that of the sample not containing Cu. This result indicates that Cu occupied part of the Na/Li sites and restricted pinning of spontaneous polarization. As for the sample according to the present invention, the magnitudes of coercive electric field and remanent polarization were changed depending on the amount of $LiNbO_3$. As $LiNbO_3$ increased, the coercive electric field increased from 1 kV/mm to 5 kV/mm at the maximum. The remanent polarization increased from 15 $\mu C/cm^2$ to 25 $\mu C/cm^2$.

The hysteresis curve measured before polarization was not a propeller-type double loop, but a single loop. A shift in the X axis direction of the hysteresis loop measured after polarization was not ascertained significantly. Therefore, occupation of the B site by Cu was not supported positively.

Example 23

Powders of sodium niobate ($NaNbO_3$), barium titanate ($BaTiO_3$), lithium niobate ($LiNbO_3$), and copper(II) oxide were weighed in such a way that Na, Ba, Li, Nb, Ti, and Cu ratios constituted the composition described in Example 5. The weighed raw material powders were blended and mixing was performed in a ball mill for a night. The mixed powder was calcined in an alumina crucible at 950° C. for 5 hours. The calcined powder was pulverized and mixed again in a ball mill for a night.

Green sheets having a thickness of 50 μm were obtained by adding PVB to the resulting calcined powder, performing mixing, and forming sheets by a doctor blade method.

An electrically conductive paste for an internal electrode was printed on the above-described green sheet. A 70% Ag-30% Pd alloy (Ag/Pd=2.33) paste was used as the electrically conductive paste. Nine green sheets coated with the electrically conductive paste were stacked and the resulting stacked body was fired under the condition of 1,150° C. for 5 hours to obtain a sintered body. The above-described sintered body was cut into the size of 10 mm×2.5 mm, the side surfaces thereof were ground, and a pair of external electrodes (first electrode and second electrode) to short-circuit the internal electrodes alternately were formed by Au sputtering, so that a stacked piezoelectric element, as shown in FIG. 2B, was produced.

The internal electrodes of the resulting stacked piezoelectric element were observed. As a result, Ag—Pd serving as an electrode material and the piezoelectric material were formed alternately.

The sample was subjected to a polarization treatment prior to the evaluation of the piezoelectricity. Specifically, the sample was heated to 150° C. in an oil bath, a voltage of 3 kV/mm was applied between the first electrode and the second electrode for 30 minutes, and cooling to room temperature was performed while the voltage was applied.

The piezoelectricity of the resulting stacked piezoelectric element was evaluated. As a result, sufficient insulating property was exhibited and good piezoelectric characteristics equivalent to the piezoelectric material in Example 5 were obtained.

Example 24

Green sheets having a thickness of 50 μm were obtained in the same manner as with Example 23. An electrically conductive paste for an internal electrode was printed on the above-described green sheet. A Ni paste was used as the electrically conductive paste. Nine green sheets coated with the electrically conductive paste were stacked and the resulting stacked body was thermocompression-bonded.

The thermocompression-bonded stacked body was fired in a tube furnace. Firing was performed in the air up to 300° C. to remove binder, the atmosphere was switched to a reducing atmosphere ($H_2:N_2$=2:98, oxygen concentration $2×10^{-6}$ Pa), and 1,150° C. was maintained for 5 hours. In a temperature lowering step, the oxygen concentration was switched to 30 Pa at 1,000° C. or lower and cooling to room temperature was performed.

The thus obtained sintered body was cut into the size of 10 mm×2.5 mm, the side surfaces thereof were ground, and a pair of external electrodes (first electrode and second electrode) to short-circuit the internal electrodes alternately were formed by Au sputtering, so that a stacked piezoelectric element, as shown in FIG. 3B, was produced.

The internal electrodes of the resulting stacked piezoelectric element were observed. As a result, Ni serving as an electrode material and the piezoelectric material layer were formed alternately. The resulting stacked piezoelectric element was subjected to a polarization treatment by applying an electric field of 2 kV/mm for 30 minutes in an oil bath maintained at 150° C. The piezoelectric characteristics of the resulting stacked piezoelectric element were evaluated. As a result, sufficient insulating property was exhibited and good piezoelectric characteristics equivalent to the piezoelectric element in Example 5 were obtained.

Example 25

The liquid ejection head shown in FIGS. 3A and 3B was produced by using the piezoelectric element in Example 5. Ejection of ink following the input electric signal was ascertained.

Example 26

The liquid ejection apparatus shown in FIG. 4 was produced by using the liquid ejection head in Example 25. Ejection of ink following the input electric signal was ascertained on a recording medium.

Example 27

The ultrasonic motor shown in FIG. 6B was produced by using the piezoelectric element in Example 5. Rotation of the motor in accordance with the application of an alternating current voltage was ascertained.

Example 28

The optical apparatus shown in FIGS. 7A and 7B was produced by using the ultrasonic motor in Example 27. An autofocus action in accordance with the application of an alternating current voltage was ascertained.

Example 29

The dust removal apparatus shown in FIGS. 9A and 9B was produced by using the piezoelectric element in Example 5. Plastic beads were distributed and an alternating current voltage was applied. As a result, a good dust removal efficiency was ascertained.

Example 30

The image pickup apparatus shown in FIG. 12 was produced by using the dust removal apparatus in Example 29. As a result of an action, dust on the surface of the image pickup element unit was removed favorably, and an image with no dust defect was obtained.

Example 31

The liquid ejection head shown in FIGS. 3A and 3B was produced by using the stacked piezoelectric element in Example 23. Ejection of ink following the input electric signal was ascertained.

Example 32

The liquid ejection apparatus shown in FIG. 4 was produced by using the liquid ejection head in Example 31. Ejection of ink following the input electric signal was ascertained on a recording medium.

Example 33

The ultrasonic motor shown in FIG. 6B was produced by using the stacked piezoelectric element in Example 23. Rotation of the motor in accordance with the application of an alternating current voltage was ascertained.

Example 34

The optical apparatus shown in FIGS. 7A and 7B was produced by using the ultrasonic motor in Example 33. An autofocus action in accordance with the application of an alternating current voltage was ascertained.

Example 35

The dust removal apparatus shown in FIGS. 9A and 9B was produced by using the stacked piezoelectric element in Example 23. Plastic beads were distributed and an alternating current voltage was applied. As a result, a good dust removal efficiency was ascertained.

Example 36

The image pickup apparatus shown in FIG. 12 was produced by using the dust removal apparatus in Example 35. As a result of an action, dust on the surface of the image pickup element unit was removed favorably, and an image with no dust defect was obtained.

Example 37

The electronic apparatus shown in FIG. 14 was produced by using the stacked piezoelectric element in Example 23. A speaker action in accordance with the application of an alternating current voltage was ascertained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-186595, filed Aug. 27, 2012, which is hereby incorporated by reference herein in its entirety.

INDUSTRIAL APPLICABILITY

The piezoelectric material according to an aspect of the present invention exhibits good piezoelectricity at a high environment temperature as well. In addition, lead is not included and, therefore, a load to the environment is small. Consequently, the piezoelectric material according to an aspect of the present invention is utilized for apparatuses including the piezoelectric material to a large extent, for example, liquid ejection heads, ultrasonic motors, and dust removal apparatuses with no problem.

REFERENCE SIGNS LIST 1 first electrode
2 piezoelectric material
3 second electrode
101 piezoelectric element
102 individual liquid chamber
103 diaphragm
104 liquid chamber partition
105 ejection orifice
106 communicating hole
107 common liquid chamber
108 buffer layer
1011 first electrode
1012 piezoelectric material
1013 second electrode
201 vibrator
202 rotor
203 output shaft
204 vibrator
205 rotor
206 spring
2011 elastic ring
2012 piezoelectric element
2013 organic adhesive
2041 metal elastic body
2042 stacked piezoelectric element
310 dust removal apparatus
320 diaphragm
330 piezoelectric element
331 piezoelectric material
332 first electrode
333 second electrode
336 first electrode surface
337 second electrode surface
51 first electrode
53 second electrode
54 piezoelectric material layer
55 internal electrode
501 first electrode
503 second electrode
504 piezoelectric material layer
505 internal electrode 506a external electrode
506b external electrode
601 camera main body
602 mount portion
605 mirror box
606 main mirror
200 shutter unit
300 main body chassis
400 image pickup element unit
701 front group lens
702 rear group lens (focus lens)
711 attach and detach mount
712 fixed barrel
713 linear guide barrel
714 front group barrel
715 cam ring
716 rear group barrel
717 cam roller
718 shaft screw
719 roller
720 rotation transmission ring
722 roller bearing
724 manual focus ring
725 ultrasonic motor
726 wave washer
727 ball race
728 focus key
729 connection member
732 washer
733 low-friction sheet
881 liquid ejection apparatus
882 outer cover
883 outer cover
884 outer cover
885 outer cover
887 outer cover
890 recovery portion
891 recording portion
892 carriage
896 apparatus main body
897 automatic feeding portion
898 discharge port
899 conveying portion
901 optical apparatus
908 release button
909 strobe light emission portion
912 speaker
914 microphone
916 fill light portion
931 main body
932 zoom lever
933 power source button

The invention claimed is:
1. A piezoelectric material comprising:
metal oxide represented by General formula (1); and
0.04 percent by mole or more and 2.00 percent by mole or less of Cu relative to 1 mol of the metal oxide,

$((Na_{1-z}Li_z)_xBa_{1-y})(Nb_yTi_{1-y})O_3$ (in Formula, $0.70 \leq x \leq 0.99$, $0.75 \leq y \leq 0.99$, and $0 < z < 0.15$), General formula (1)

wherein in General formula (1), x<y holds.
2. The piezoelectric material according to claim 1, wherein in General formula (1), $0.75 \leq y \leq 0.89$ holds.
3. A piezoelectric element comprising:
a first electrode;
a piezoelectric material portion; and
a second electrode,
wherein the piezoelectric material constituting the piezoelectric material portion is the piezoelectric material according to claim 1.
4. A stacked piezoelectric element in which piezoelectric material layers and electrodes including internal electrode are stacked alternately,
wherein the piezoelectric material constituting the piezoelectric material layer is the piezoelectric material according to claim 1.
5. The stacked piezoelectric element according to claim 4, wherein the internal electrode contains Ag and Pd, and
the weight ratio M1/M2 of the weight of Ag contained (M1) to the weight of Pd contained (M2) satisfies $1.5 \leq M1/M2 \leq 9.0$.
6. The stacked piezoelectric element according to claim 4, wherein the internal electrode contains at least one type of Ni and Cu.
7. A method for manufacturing the stacked piezoelectric element according to claim 4, comprising the steps of:
producing a slurry by dispersing the piezoelectric material in Step (A);
producing a compact from the slurry in Step (B);
forming an electrode on the compact in Step (C); and
producing a stacked piezoelectric element by sintering a compact formed by stacking the compacts containing the metal compounds and the electrodes alternately in Step (D),
wherein the sintering temperature in Step (D) is 1,200° C. or lower.
8. A liquid ejection head comprising:
a liquid chamber provided with a vibration portion incorporated with the piezoelectric element according to claim 3; and
an ejection orifice communicating the liquid chamber.
9. A liquid ejection apparatus comprising:
a recording medium conveying portion; and
the liquid ejection head according to claim 8.
10. An ultrasonic motor comprising:
a vibration member incorporated with the piezoelectric element according to claim 3; and
a mobile member in contact with the vibration member.
11. An optical apparatus comprising the ultrasonic motor according to claim 10 in a drive portion.
12. A vibration apparatus comprising a vibration member incorporated with the piezoelectric element according to claim 3 on a diaphragm.
13. A dust removal apparatus comprising the vibration apparatus according to claim 12 in a vibration portion.
14. An image pickup apparatus comprising:
the dust removal apparatus according to claim 13; and
an image pickup element unit,
wherein a diaphragm of the dust removal apparatus is disposed on the light receiving surface side of the image pickup element unit.
15. An electronic apparatus comprising a piezoelectric acoustic component provided with the piezoelectric element according to claim 3.
16. A liquid ejection head comprising:
a liquid chamber provided with a vibration portion incorporated with the stacked piezoelectric element according to claim 4; and
an ejection orifice communicating the liquid chamber.

17. A liquid ejection apparatus comprising:
a recording medium conveying portion; and
the liquid ejection head according to claim 16.

18. An ultrasonic motor comprising:
a vibration member incorporated with the stacked piezoelectric element according to claim 4; and
a mobile member in contact with the vibration member.

19. An optical apparatus comprising the ultrasonic motor according to claim 18 in a drive portion.

20. A vibration apparatus comprising a vibration member incorporated with the stacked piezoelectric element according to claim 4 on a diaphragm.

21. A dust removal apparatus comprising the vibration apparatus according to claim 20 in a vibration portion.

22. An image pickup apparatus comprising:
the dust removal apparatus according to claim 21; and
an image pickup element unit,
wherein a diaphragm of the dust removal apparatus is disposed on the light receiving surface side of the image pickup element unit.

23. An electronic apparatus comprising a piezoelectric acoustic component provided with the stacked piezoelectric element according to claim 4.

\* \* \* \* \*